US009606444B2

(12) United States Patent
Dmitriev et al.

(10) Patent No.: US 9,606,444 B2
(45) Date of Patent: Mar. 28, 2017

(54) METHOD AND APPARATUS FOR LOCALLY DEFORMING AN OPTICAL ELEMENT FOR PHOTOLITHOGRAPHY

(75) Inventors: Vladimir Dmitriev, Moran (IL); Uri Stern, Tivon (IL)

(73) Assignee: Carl Zeiss SMS Ltd., Karmiel (IL)

(*) Notice: Subject to any disclaimer, the term of this patent is extended or adjusted under 35 U.S.C. 154(b) by 44 days.

(21) Appl. No.: 14/238,803

(22) PCT Filed: Aug. 21, 2012

(86) PCT No.: PCT/IL2012/000307
§ 371 (c)(1),
(2), (4) Date: Dec. 1, 2014

(87) PCT Pub. No.: WO2013/030820
PCT Pub. Date: Mar. 7, 2013

(65) Prior Publication Data
US 2015/0085269 A1    Mar. 26, 2015

Related U.S. Application Data

(60) Provisional application No. 61/527,894, filed on Aug. 26, 2011.

(51) Int. Cl.
*G03B 27/68* (2006.01)
*G03F 7/20* (2006.01)
(Continued)

(52) U.S. Cl.
CPC .......... *G03F 7/70191* (2013.01); *B82Y 10/00* (2013.01); *B82Y 40/00* (2013.01);
(Continued)

(58) Field of Classification Search
CPC ..... G03F 1/72; G03F 7/70191; G03F 7/70025
(Continued)

(56) References Cited

U.S. PATENT DOCUMENTS 7,001,697 B2    2/2006 Park et al.
8,539,394 B2 *  9/2013 Pforr ................. G03F 7/70633
                                              716/51
(Continued)

FOREIGN PATENT DOCUMENTS

EP    2209046       7/2010
JP    64-18149      1/1989 .............. G03F 1/00
(Continued)

OTHER PUBLICATIONS

Korean Office Action for Korean Application No. 10-2014-7006398 dated Oct. 20, 2015 (12 pages).
(Continued)

*Primary Examiner* — Hung Henry Nguyen
(74) *Attorney, Agent, or Firm* — Fish & Richardson P.C.

(57) ABSTRACT

The invention relates to a method for locally deforming an optical element for photolithography in accordance with a predefined deformation form comprising: (a) generating at least one laser pulse having at least one laser beam parameter; and (b) directing the at least one laser pulse onto the optical element, wherein the at least one laser beam parameter of the laser pulse is selected to yield the predefined deformation form.

22 Claims, 24 Drawing Sheets

(51) Int. Cl.
*G03F 1/72* (2012.01)
*B82Y 10/00* (2011.01)
*B82Y 40/00* (2011.01)
*G03F 1/60* (2012.01)
*G03F 7/00* (2006.01)

(52) U.S. Cl.
CPC ............ *G03F 1/72* (2013.01); *G03F 7/70025* (2013.01); *G03F 1/60* (2013.01); *G03F 7/0002* (2013.01)

(58) Field of Classification Search
USPC .................................. 355/52, 53, 55, 67–71
See application file for complete search history.

(56) References Cited

U.S. PATENT DOCUMENTS

| | | | | |
|---|---|---|---|---|
| 2007/0224522 | A1* | 9/2007 | Lee | G03F 1/14 430/5 |
| 2008/0198380 | A1* | 8/2008 | Straaijer | G01B 11/0641 356/369 |

FOREIGN PATENT DOCUMENTS

| | | | | |
|---|---|---|---|---|
| JP | 2005-157375 | 6/2005 | ............... | G03F 1/14 |
| JP | 2006-179600 | 7/2006 | ............... | H01S 3/23 |
| JP | 2009-230020 | 10/2009 | ............... | G03F 1/08 |
| KR | 10-2005-0051030 | 6/2005 | ............... | G02F 1/13 |

OTHER PUBLICATIONS

Erez Graitzer et al. "Correcting Image Placement Errors Using Registration Control (RegC) Technology" Proceedings of SPIE. vol. 7974, Mar. 17, 2011.

S. Oshenkov, V. Dmitriev, E. Zait, and G. Ben-Zvi: "DUV attenuation structures in fused silica induced ultra-short laser radiation," Proc. CLEOE-IQEC, Munich 2007.

Japanese Office Action for Japanese Patent Application No. 2014-527809 dated Feb. 26, 2015 (13 pages).

International Preliminary Report on Patentability and Written Opinion for International Application No. PCT/IL2012/000307 dated Mar. 13, 2014 (7 pages).

* cited by examiner

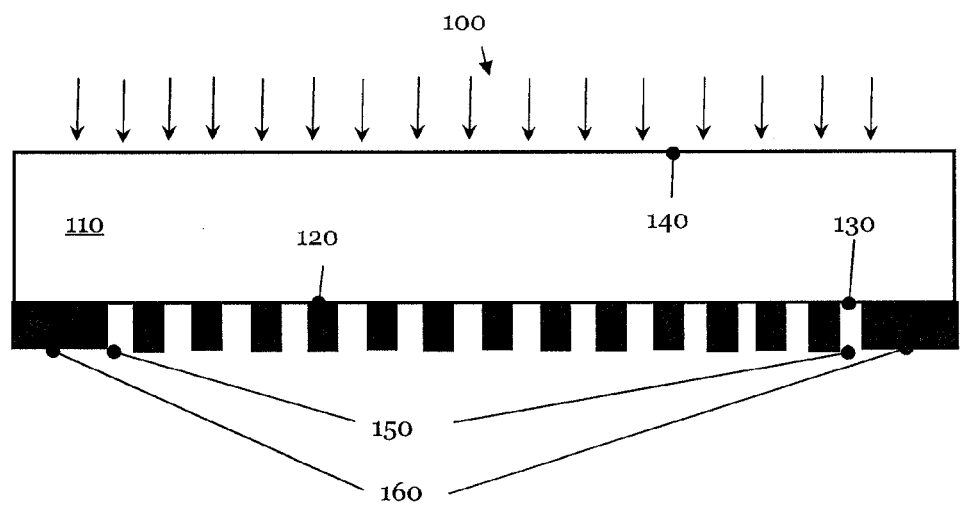
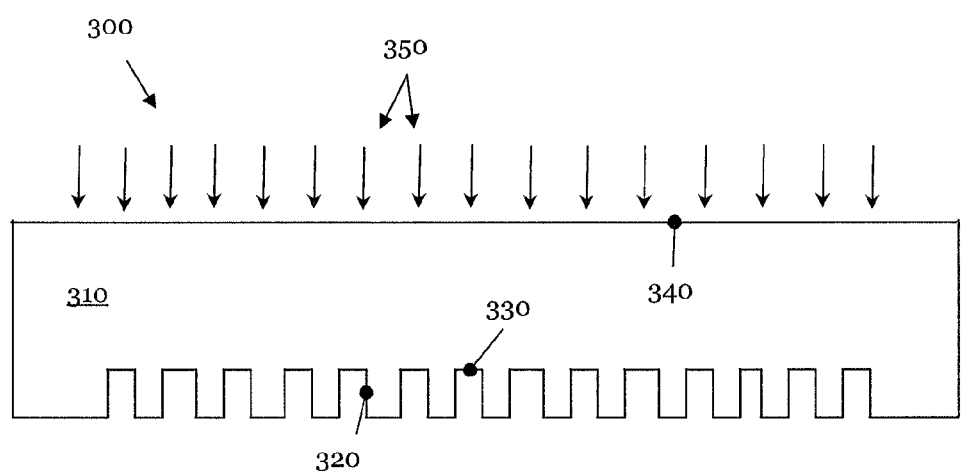

METHOD AND APPARATUS FOR LOCALLY DEFORMING AN OPTICAL ELEMENT FOR PHOTOLITHOGRAPHY

CROSS-REFERENCE TO RELATED APPLICATIONS

This application is a National Stage application under 35 U.S.C. §371 of International Application No. PCT/IL2012/000307 having a filing date of Aug. 21, 2012, which claims priority to U.S. Application No. 61/527,894, filed on Aug. 26, 2011, the entire contents of which are hereby incorporated by reference.

1. FIELD OF THE INVENTION

The present invention relates to the field of locally deforming an optical element for photolithography.

2. BACKGROUND OF THE INVENTION

As a result of the constantly increasing integration density in the semiconductor industry, photolithographic masks have to project smaller and smaller structures onto a photosensitive layer, e.g. a photoresist on wafers. In order to fulfil this demand, the exposure wavelength of photolithographic masks has been shifted from the near ultraviolet across the mean ultraviolet into the far ultraviolet region of the electromagnetic spectrum. Presently, a wavelength of 193 nm is typically used for the exposure of the photoresist on wafers. As a consequence, the manufacturing of photolithographic masks with increasing resolution is becoming more and more complex, and thus more and more expensive as well. In the future, photolithographic masks will use significantly smaller wavelengths in the extreme ultraviolet (EUV) wavelength range of the electromagnetic spectrum (e.g. in the range of 10 nm-15 nm).

Photolithographic masks have to fulfil highest demands with respect to transmission homogeneity, planarity, pureness and temperature stability. The tolerable deviation of their substrates from the planarity is only a portion of a wavelength of the exposure wavelength in order to not significantly disturb the phase front of the electromagnetic wave reflected from a multi-layer structure on a surface of the substrate. Larger deviations of the planarity of the substrate of the photolithographic mask may lead to variations of the optical intensity distribution in the photoresist due to a constructive or a destructive superposition of the wave front in the photoresist. A decrease of the exposure wavelength makes this problem more challenging. The substrate as supplied from the manufacturer may not even fulfil the planarity condition for EUV photolithographic masks and the manufacturing process of the mask which forms fine patterns on one surface may even deteriorate the planarity of the substrate.

The US patent application US 2007/02245222 A1 describes a method to improve the planarity of a manufactured photolithographic mask. The U.S. Pat. No. 7,001,697 B2 provides another method to eliminate intensity differences or optical transmission errors introduced by a photolithographic mask in the photoresist on a wafer.

For transmissive photolithographic masks the homogeneity of the optical transmission across the mask area is an important parameter. The uniformity of a structure element across the area of the photolithographic mask is called critical dimension uniformity (CDU).

Moreover, photolithographic masks may also have placement errors of pattern elements, i.e. some of the pattern elements do not image the pattern parameters exactly at the predetermined position on the photoresist. Placement errors are also called registration errors.

The action of femtosecond laser pulses on a quartz substrate has for example been investigated by S. Oshenkov, V. Dmitriev, E. Zait, and G. Ben-Zvi: "DUV attenuation structures in fused silica induced ultra-short laser radiation", Proc. CLEOE-IQEC, Munich 2007.

For an improvement of a registration and/or of a CD correction result, it is extremely important to control all parameters of the laser pulses in order to control the local deformation introduced in a substrate of a photolithographic mask.

On the other hand, it is clear that for a successful simultaneous CD and registration correction, it is necessary that the laser pulses are able to induce any possible elementary deformation in the mask substrate. For this purpose, it is required to provide a comprehensive set of laser pulses leading to a broad spectrum of local deformations. This spectrum comprises at the one end laser pulses which provide a minimum local deformation at a given attenuation of the optical transmission in order to correct CD errors. On the other hand, in order to correct placement or registration errors, laser pulses are required having a large asymmetric local deformation.

It is therefore one object of the present invention to provide a method and an apparatus for locally deforming an optical element and to avoid at least a portion of the problems discussed above.

3. SUMMARY OF THE INVENTION

According to a first aspect of the invention, a method according to patent claim 1 is provided. In an embodiment, a method for locally deforming an optical element for photolithography in accordance with a predefined deformation form comprises (a) generating at least one laser pulse having at least one laser beam parameter, and (b) directing the at least one laser pulse onto the optical element, wherein the at least one laser beam parameter of the laser pulse is selected to yield the predefined deformation form.

By controlling the optical intensity distribution the effect of the local deformation can be adjusted to correspond to a predefined deformation form. A predefined deformation form is specific for correcting a certain defect of the optical element. Thus, by inducing local variations according the predefined deformation form a certain defect of an optical element can be corrected.

In a further aspect, the at least one laser beam parameter comprises a polarisation of the at least one laser pulse.

By controlling the polarization of the laser pulse, the direction of deformation element resulting from the laser pulse can be adjusted to a predefined deformation form.

In another aspect, the at least one laser pulse is linearly polarized, and the predefined deformation form is essentially parallel to the linear polarization of the at least one laser pulse.

A linear polarization can be rotated; therefore the deformation element induced by the laser pulse can be easily aligned with respect to a predefined deformation form. The degree of anisotropy of a local deformation induced by a polarized laser pulse depends on the energy of the laser pulse and typically decreases with increasing pulse energy. Hence, the polarization control is particularly effective for the lower power range of the laser pulse.

According to a further aspect, the at least one laser pulse is elliptically polarized and a predefined elliptical deformation form is essentially aligned to the at least one elliptically polarized laser pulse. In still another aspect, the at least one laser pulse is circularly polarized, and wherein the predefined deformation form is an essentially circular deformation form of the optical element.

A circularly polarized laser beam is particularly useful to improve a variation of the optical transmission across the optical element. The induced transmission change and the induced deformation are proportional to a density of the introduced laser pulses, but independent from the orientation of the optical element with respect to the laser beam.

In a further aspect, a wave plate generates the polarization of the at least one laser pulse. In still another aspect, the wave plate comprises a half wave plate, in particular a zero order half wave plate. In yet a further aspect, the wave plate comprises a quarter wave plate, in particular a zero order quarter wave plate.

According to a further beneficial aspect, the at least one laser beam parameter comprises an astigmatism of the at least one laser pulse. In another aspect, at least one cylindrical lens generates the astigmatism of the at least one laser pulse.

By using a cylindrical lens, a focal point or a beam waist is transformed in a focal line. The resulting deformation element can be adjusted by adjusting the focusing system and the focus width of the cylindrical lens.

In another aspect, the at least one laser beam parameter comprises a beam shape of the at least one laser pulse. In a further aspect, at least one aperture generates the beam shape of the at least one laser pulse. According to a further aspect, the at least one aperture comprises a slit-like aperture with an adjustable width, and/or the at least one aperture is rotatable around a beam direction of the at least one laser pulse.

The aperture clips a portion of the laser beam in order to form a laser beam having essentially the predefined deformation form. Beam forming by clipping can be easily performed by an adjustable slit. On the other hand, beam forming by clipping may introduce distortions in the formed laser beam which may deteriorate the beam quality. The term "essentially" used here and at further positions within this description means a numerical value of a measured quantity within its error of measurement.

In another preferred aspect, a prism combination generates the beam shape of the at least one laser pulse. According to a further aspect, the prism combination comprises at least two prisms rotatable around the beam direction of the at least one laser pulse and a first prism is adjustable with respect to an input beam and/or a second prism is adjustable with respect to an output beam.

The implementation of beam forming or beam shaping on the basis of a prism combination is more involved than beam forming by clipping, but avoids a potentially detrimental effect on the quality of the laser beam.

According to a second aspect of the invention, a method according to patent claim 14 is provided. In an embodiment, a method for locally deforming an optical element for photolithography in accordance with a predefined deformation form comprises directing at least one first and at least one second laser pulse onto the optical element creating a first and a second local deformation, wherein the combination of the first and the second local deformation essentially yields the predefined deformation form.

Instead of generating a laser pulse having a specific beam shape and thus introducing a deformation element in an optical element which reproduces a predefined deformation form, two or more laser pulses can be used having deformation elements which generate the predetermined deformation form. This approach has the advantage that it is not necessary to control the shape and/or the polarization of the laser beam in detail, i.e. an additional optical component is not required.

The inventive method can be used to generate a resulting deformation element having a specific asymmetric deformation form. On the other hand, it can also be applied to generate an essentially circular deformation form from individual unbalanced deformation elements.

In a further aspect, the first and the second local deformation partially overlap.

By at least a partial overlap of the individual deformation elements generated by the first and second laser pulse a combined or resulting deformation form can be generated from the individual deformation elements which essentially correspond to the predefined deformation form.

In another aspect, wherein creating the first and the second local deformation comprises controlling a laser pulse power of the at least one first and/or of the at least one second laser pulse, an overlap portion of the first and the second local deformation, and/or an overlap angle of the first and the second local deformation.

The pulse power of the laser pulse typically correlates with the size of the deformation element induced in an optical element. By varying the overlap portion the form or shape of the resulting deformation form can be adjusted. Further, the selection of the angle of the second pulse with respect to a predetermined direction of the optical element aligns the resulting deformation form with a predefined deformation form. Moreover, the weight or the strength of the second laser pulse relative to the first laser pulse can be adjusted. Thus, these parameters can be used to induce a predefined deformation form in an optical element with two or more individual laser pulses.

In still a further aspect, the laser pulse and/or the at least one first and the at least one second laser pulse comprise an ultra-short laser pulse, in particular a picosecond and/or a femtosecond laser pulse.

According to another aspect, a laser pulse energy is 0.05 μJ to 5 μJ, a laser pulse length is 0.05 ps to 100 ps, a repetition rate is 1 kHz to 10 MHz, a laser pulse density is 1 000 pulses per $mm^2$ to 10 000 000 laser pulses per $mm^2$, a numerical aperture of an objective is 0.1 to 0.9 and the magnification of an objective is 5× to 10×.

In another aspect, locally deforming an optical element comprises permanently locally deforming the optical element.

In a further aspect, the predetermined deformation form locally modifies a density and/or an optical transmission distribution of the optical element and/or wherein the locally modified density and/or the optical transmission distribution of the optical element is discontinuously modified within at least one small volume of the optical element, wherein the at least one small volume is called a pixel.

By locally deforming the optical element CDU defects can be corrected. Further, by reproducing a predefined deformation form with the laser pulse, placement or registration errors can also be corrected. Moreover, by applying different laser pulses inducing various local deformations in the optical element, both CDU and registration errors of an optical element can simultaneously be corrected.

According to another aspect, the predefined deformation form varies an optical transmission distribution in an interval of 0% to 10%, preferably of 0% to 5%, and most preferably of 0% to 3%.

In still another aspect, the predefined deformation form comprises an essentially circular deformation form generated with pixels having a diameter in a range of 0.1 μm to 10 μm, preferably 0.2 μm to 5 μm and most preferably 0.5 μm to 2 μm.

The induced local deformation can for example be qualified by fully writing a square of 1 mm$^2$ of an optical element with pixels leading to an attenuation of the optical transmission of 1%. Then, the resulting linear expansion of this area is typically in the range of 0.001 nm when using low power laser pulses and is in the range of 1 nm to 2 nm for high power laser pulses.

In a further aspect, the predefined deformation form comprises an essentially elliptical deformation form generated with pixels having an expansion ratio of a major and a minor axis in the range of 2 to 1, preferably 5 to 1 and most preferably 10 to 1.

Yet another aspect further comprises the step of determining at least one defect of the optical element.

For the error determination of optical elements a scanning electron microscope (SEM) and/or a scanning probe microscope can be used. Further, a light source in combination with a respective detection system such as a CCD (charge-coupled device) camera can be applied to scan the optical element in order to identify the at least one error or defect.

An example of a scanning probe microscope is an atomic force microscope (AFM). Optical tools which can be used for the error determinations are for example a wafer level critical dimension (WLCD) tool, an AIMS™ and/or a PROVE™ system. Further tools which can be applied for this purpose are DUV and/or x-ray scatterometer systems.

Still another aspect comprises the step of determining an arrangement of laser pulses to be induced in the optical element to correct the at least one defect.

According to a further aspect, the at least one defect comprises a critical dimension error and/or a registration error and the arrangement of laser pulses comprises laser pulses having different laser beam parameter sets.

The errors in optical elements, in particular an optical transmission variation are typically spacious defects which are corrected by inducing an arrangement of individual laser pulses in the optical element.

A further aspect comprises the step of directing the at least one laser pulse onto the optical element to induce the arrangement of laser pulses in the optical element.

In still another aspect, the optical element comprises a photolithographic mask, a mirror, and/or a template for a nanoimprint lithography. According to yet a further aspect, the photolithographic mask comprises a transmissive photolithographic mask having a substrate and an absorbing structure or a reflective photolithographic mask having a substrate, a multilayer structure and an absorbing structure, and wherein the mirror comprises a substrate and a multilayer structure.

In another aspect, least one laser beam parameter of the at least one first and/or of the at least one second laser pulse is selected so that the first and the second local deformation essentially yields the predefined deformation form.

The described method for selecting at least one laser beam parameter of the at least one laser pulse and the method for superimposing two or more laser pulses to yield a predefined deformation form can be combined.

According to a further aspect, an apparatus for locally deforming an optical element for photolithography in accordance with a predefined deformation form comprises (a) a light source for generating at least one laser pulse, (b) an optical component for selecting least one laser beam parameter of the at least one laser pulse, and (c) an objective for directing the at least one laser pulse onto the optical element, wherein the laser beam parameter is selected to yield the predefined deformation form.

In another aspect, the apparatus is further adapted to perform a method according to most of the above mentioned aspects.

In still a further aspect, an apparatus for locally deforming an optical element for photolithography in accordance with a predefined deformation form comprises (a) a light source for generating at least one first and at least one second laser pulse, and (b) an objective for directing the at least one first and the at least one second laser pulse onto the optical element creating a first and a second local deformation, wherein the combination of the first and the second local deformation essentially yields the predefined deformation form.

Finally, in yet another aspect, the apparatus is further adapted to perform a method according to most of the above mentioned aspects.

4. DESCRIPTION OF THE DRAWINGS

In order to better understand the present invention and to appreciate its practical applications, the following figures are provided and referenced hereafter. It should be noted that the figures are given as examples only and in no way limit the scope of the invention.

FIG. 1 shows in cross-section a schematic view of a transmissive photolithographic mask;

Figure 2:
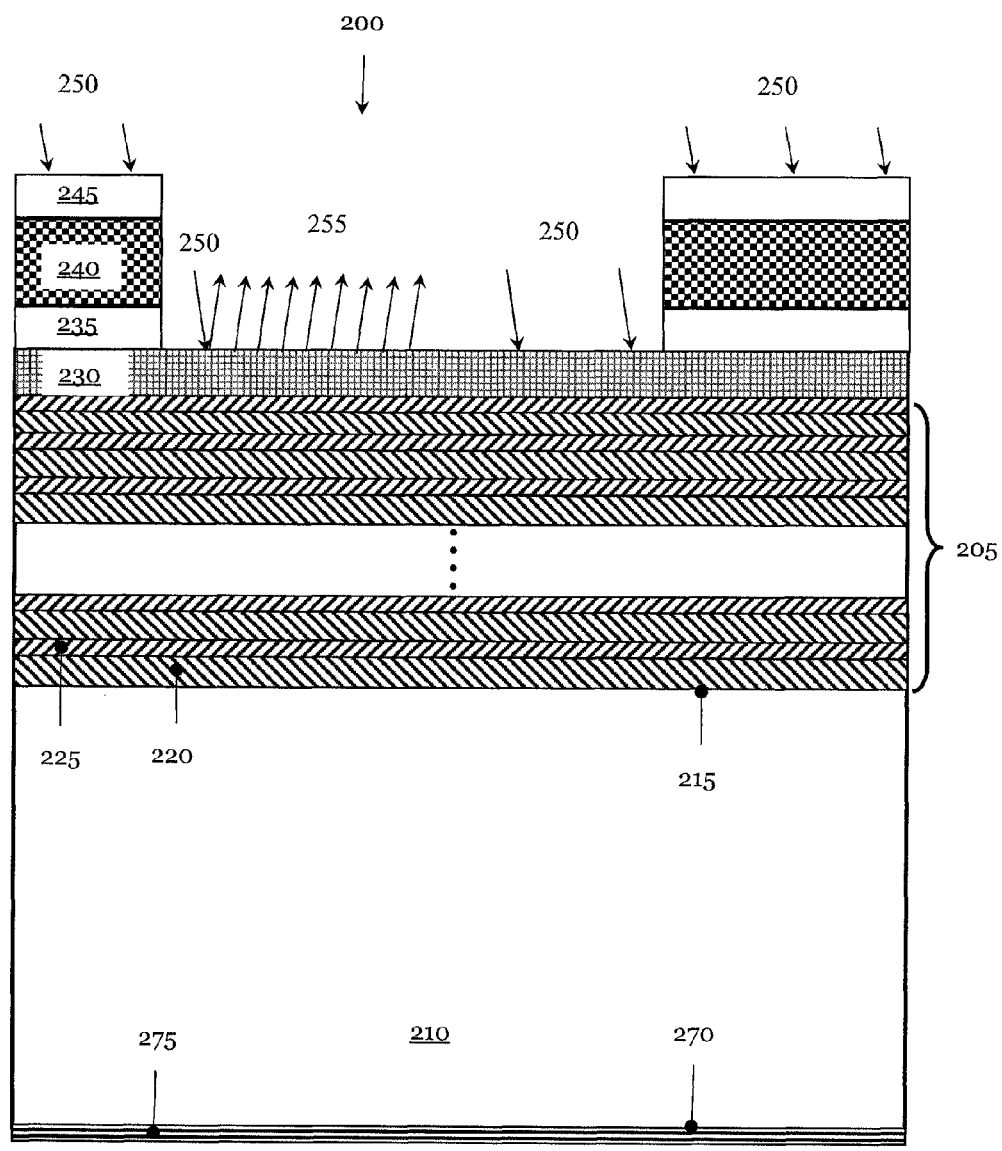
FIG. 2 shows in cross-section a schematic view of a reflective photolithographic mask.
Figure 4:
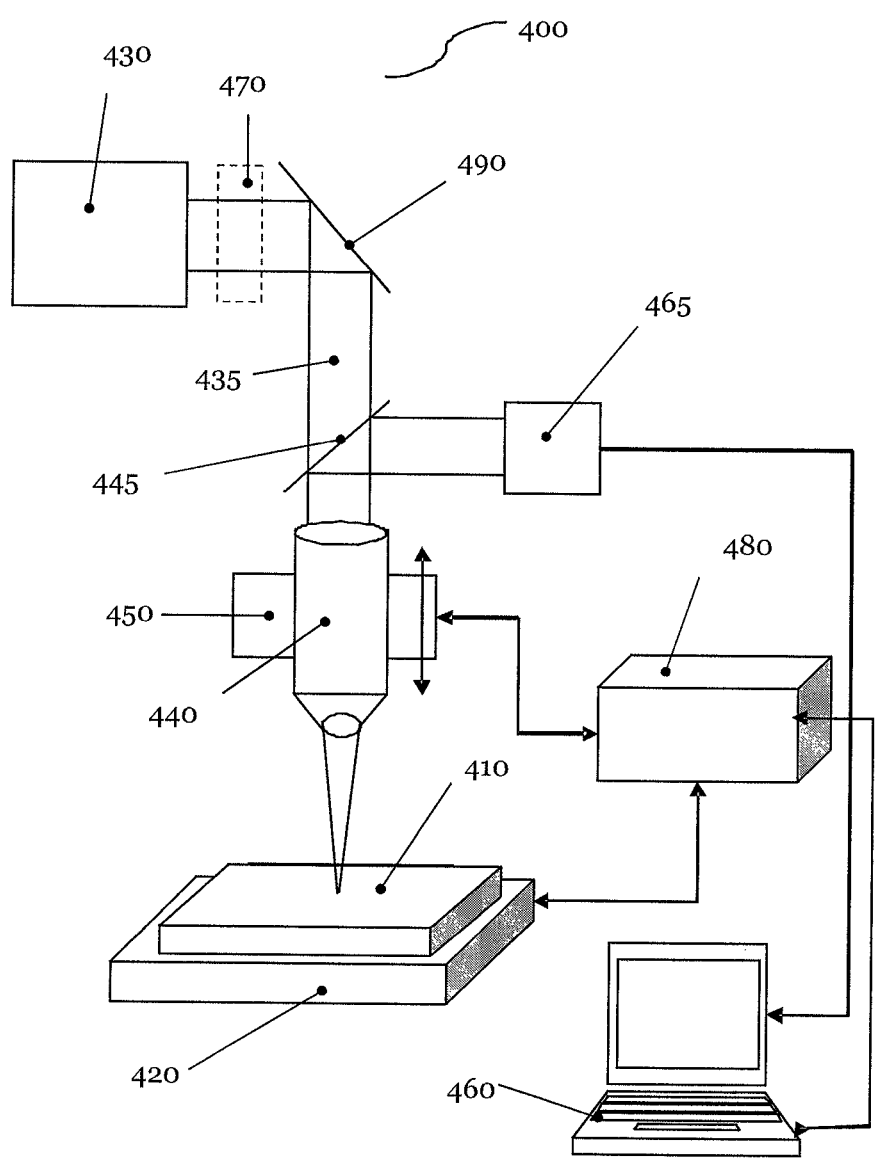
Figure 5:
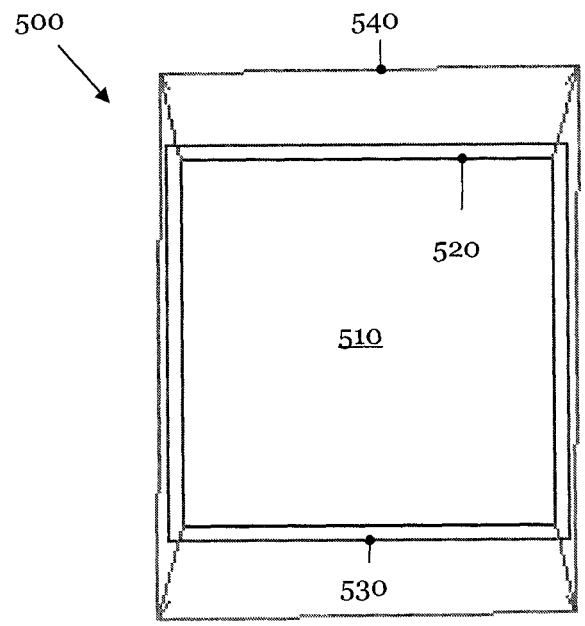
Figure 6:
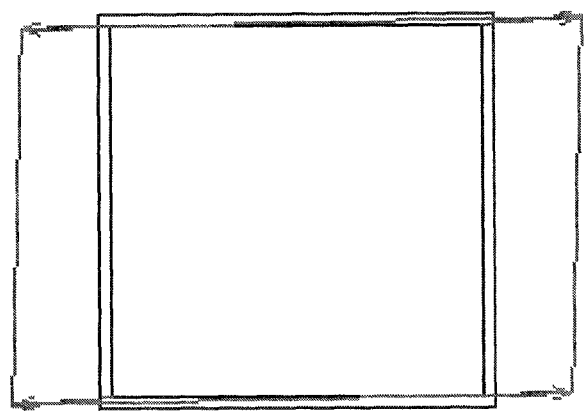
Figure 7:
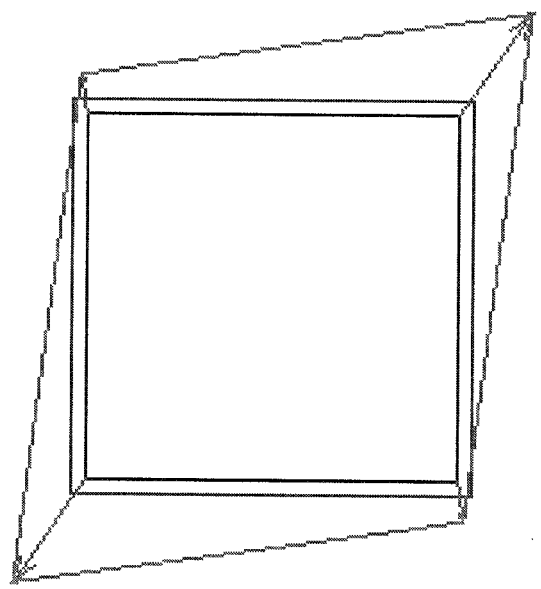
Figure 8:
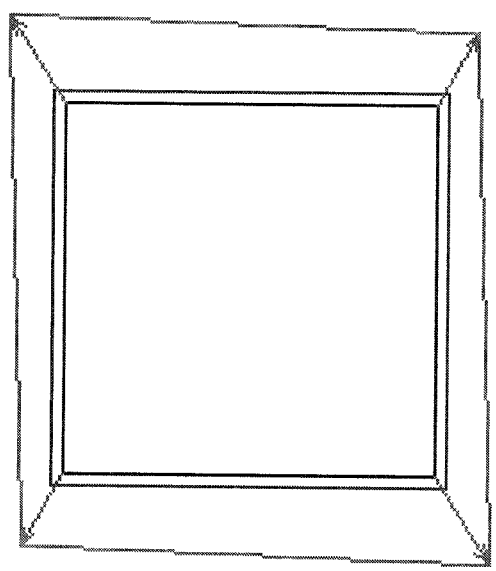
Figure 9:
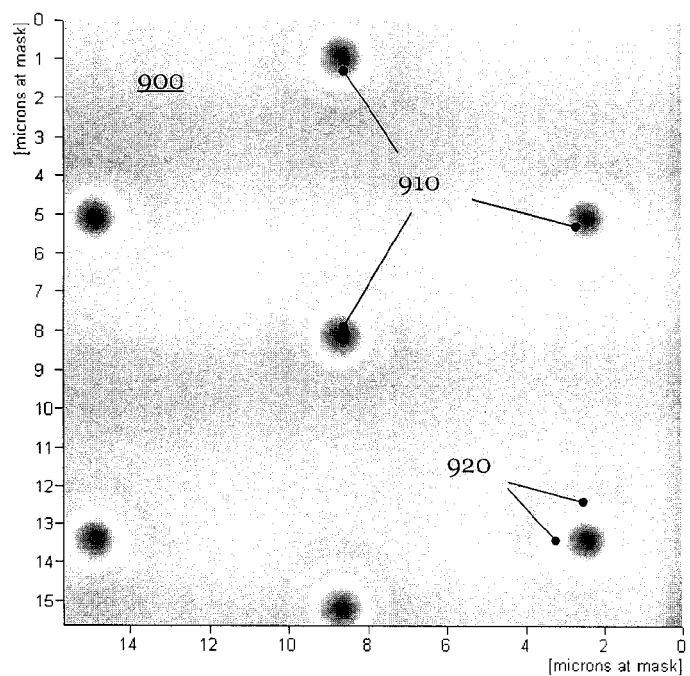
Figure 10:
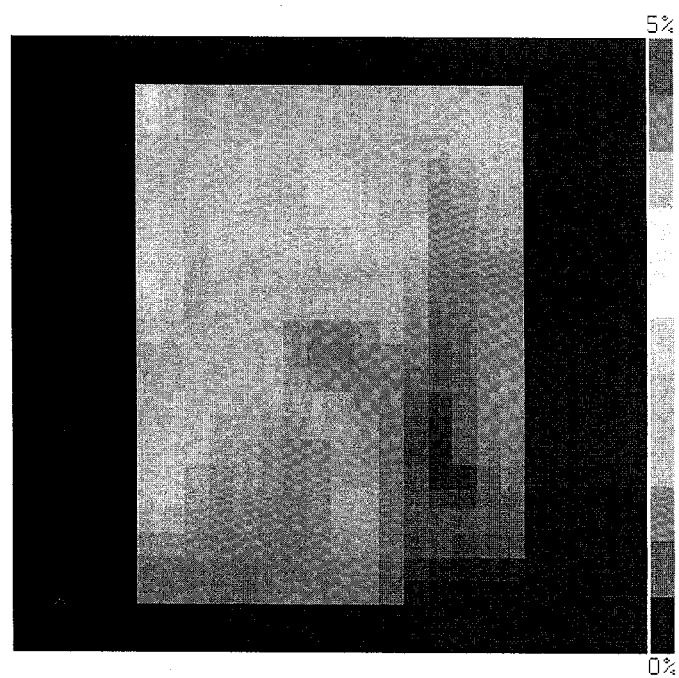
Figure 11A:
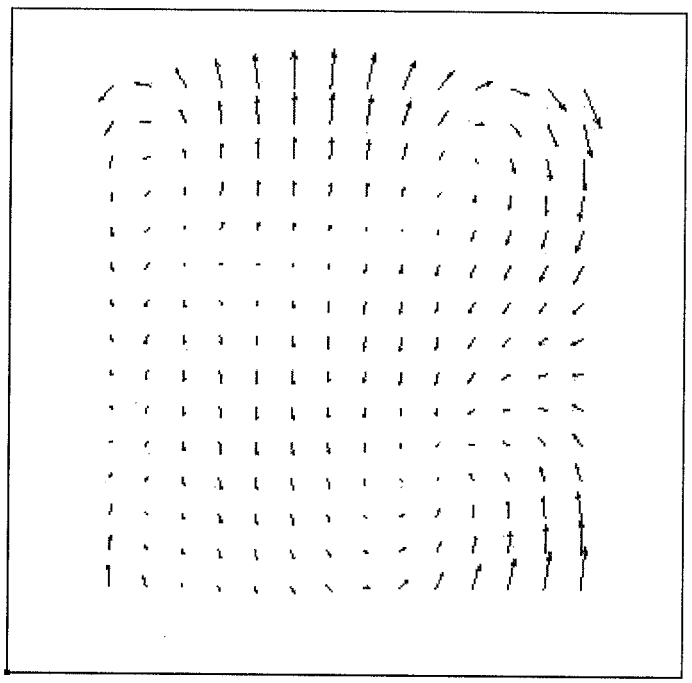
Figure 11B:
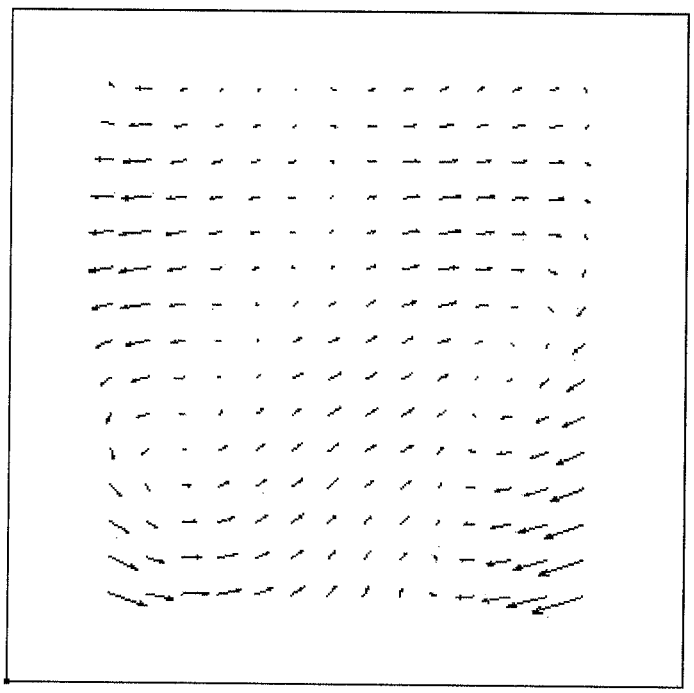
Figure 11C:
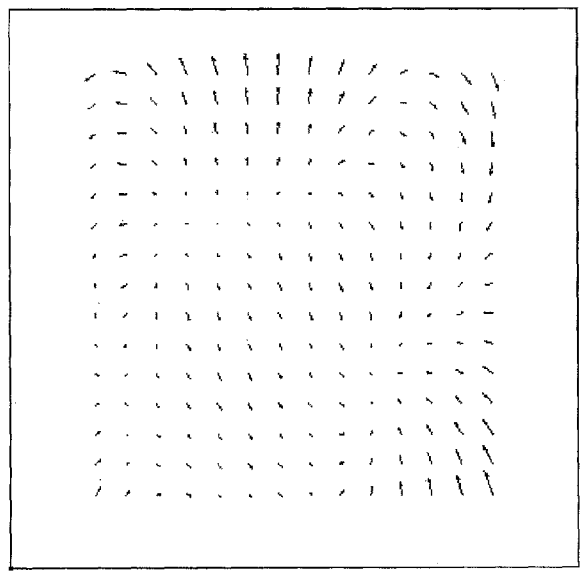
Figure 12:
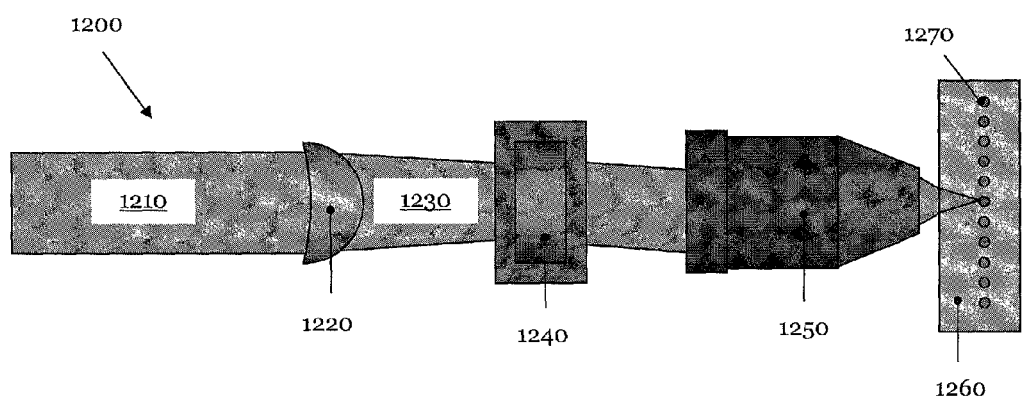
Figure 13A:
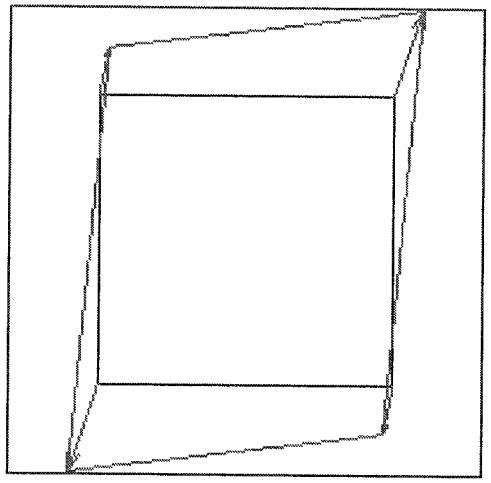
Figure 13B:
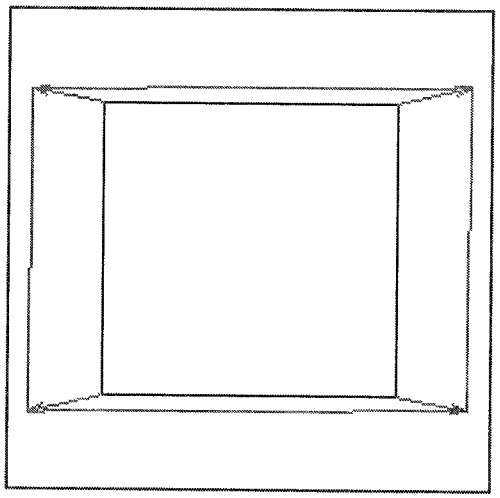
Figure 13C:
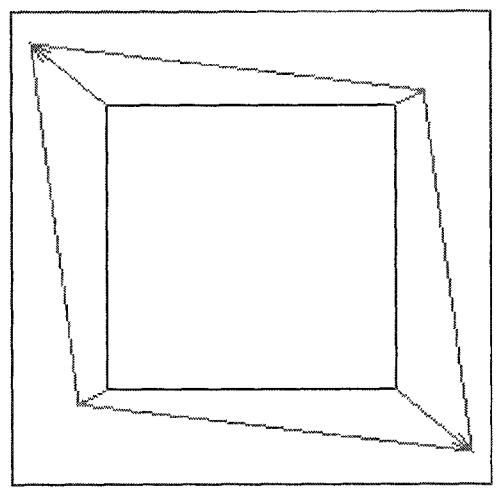
Figure 14A:
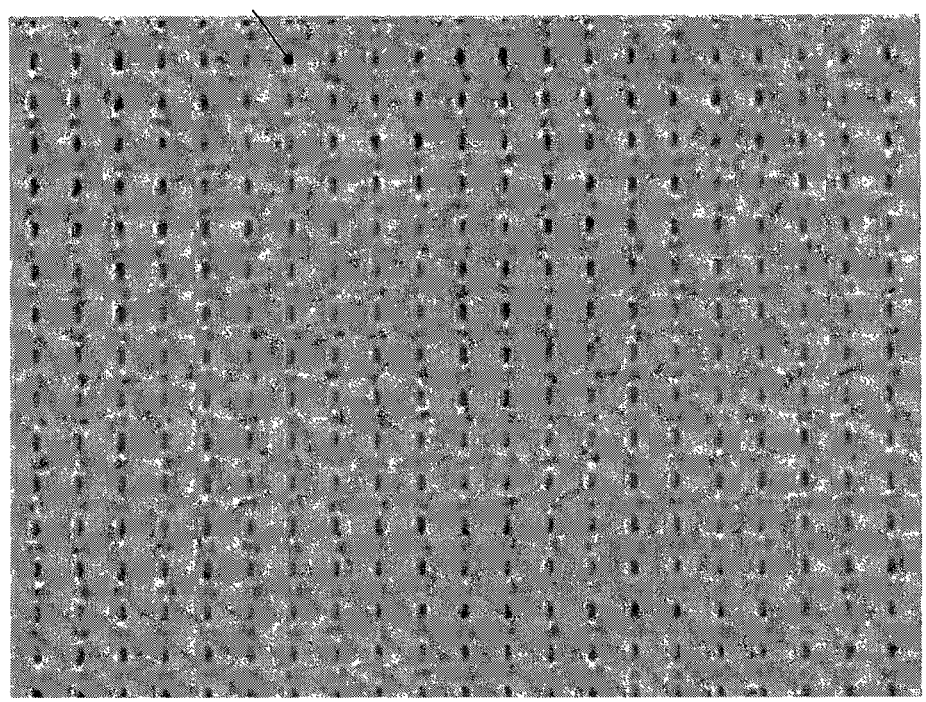
Figure 14B:
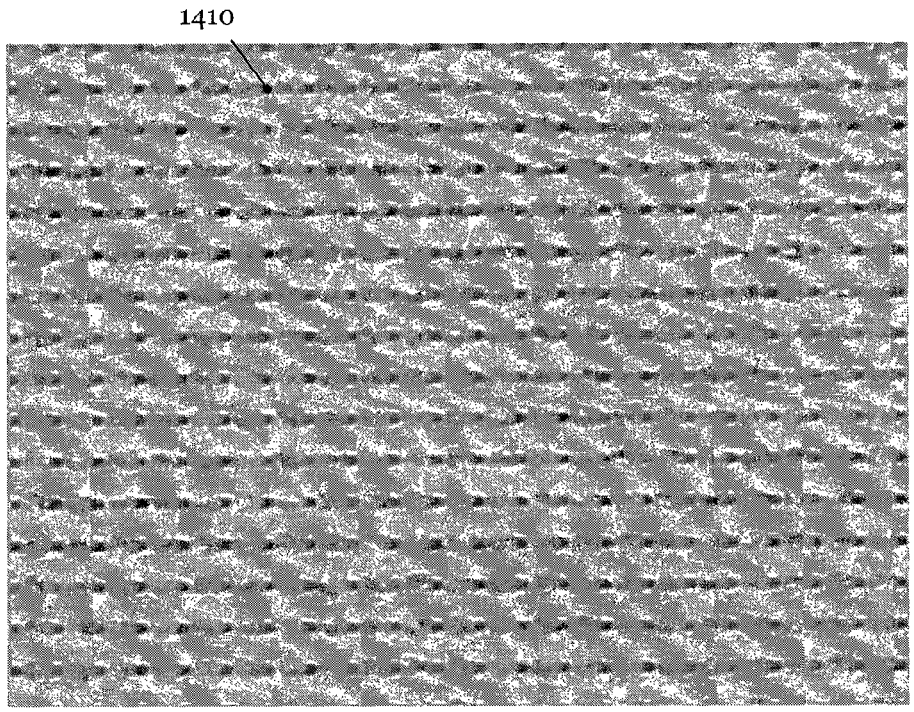
Figure 14C:
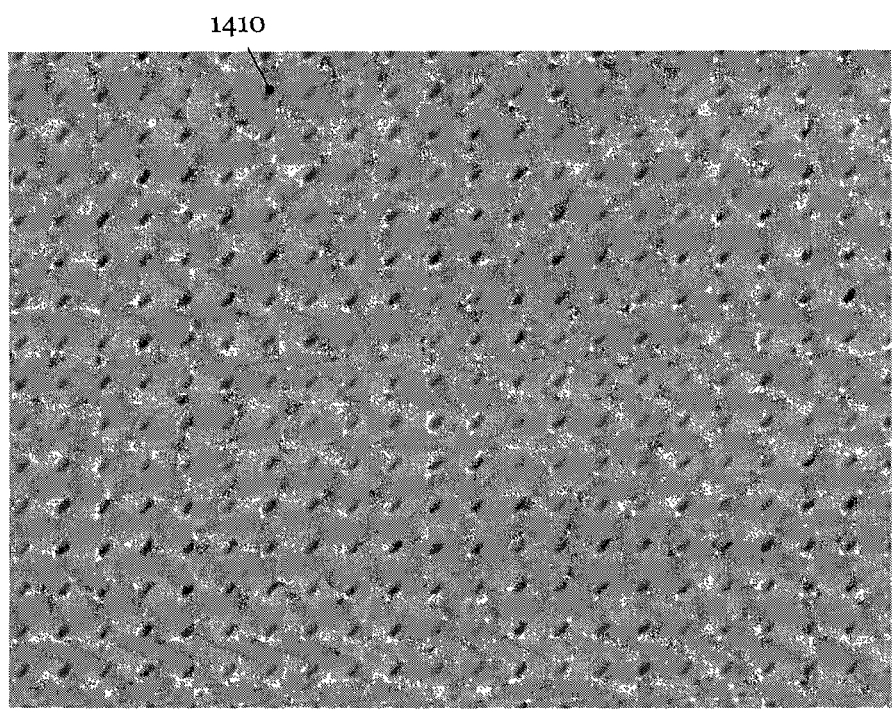
Figure 15:
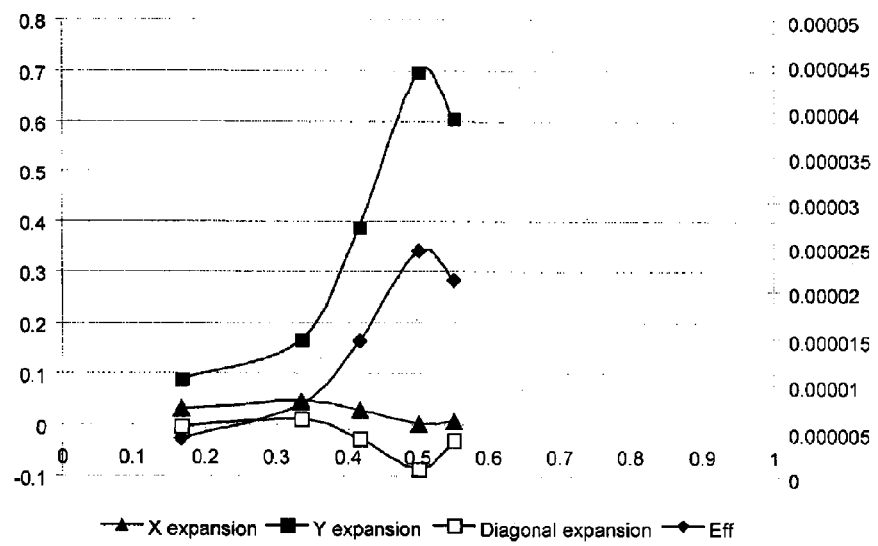
Figure 16:
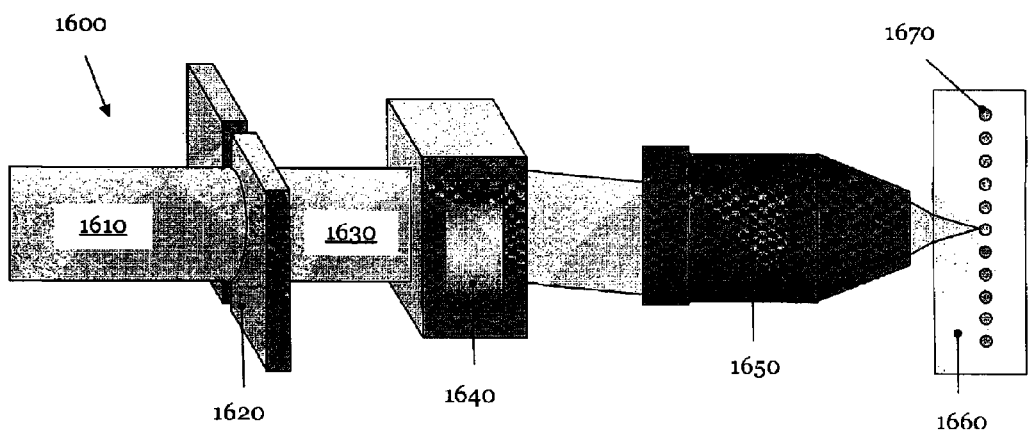
Figure 17A:
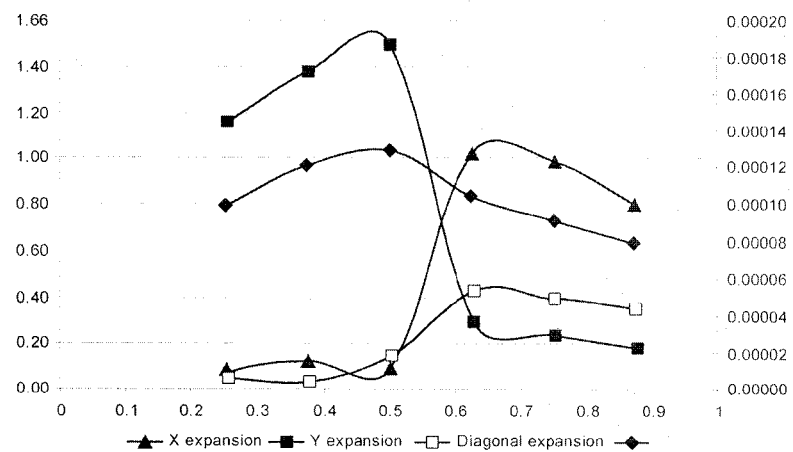
Figure 17B:
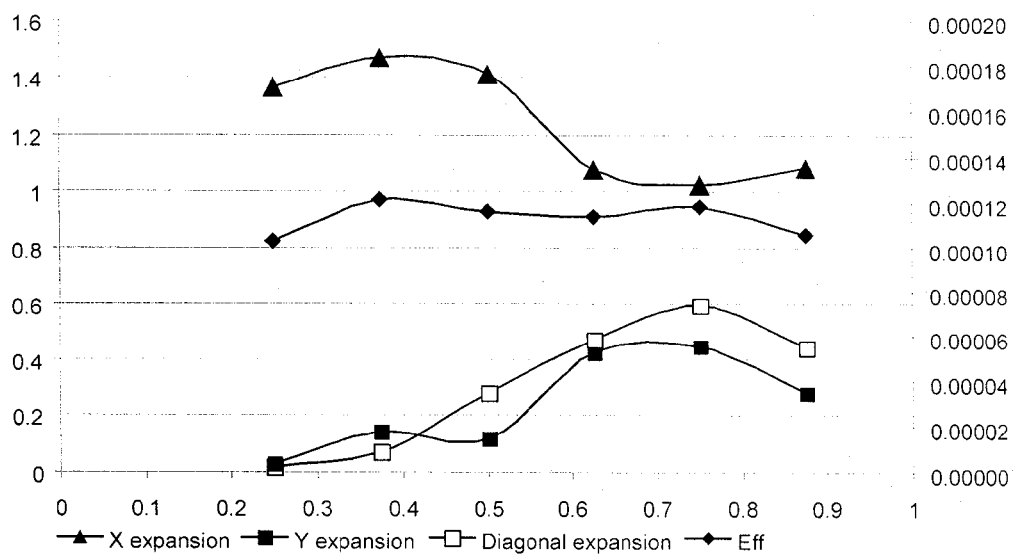
Figure 18:
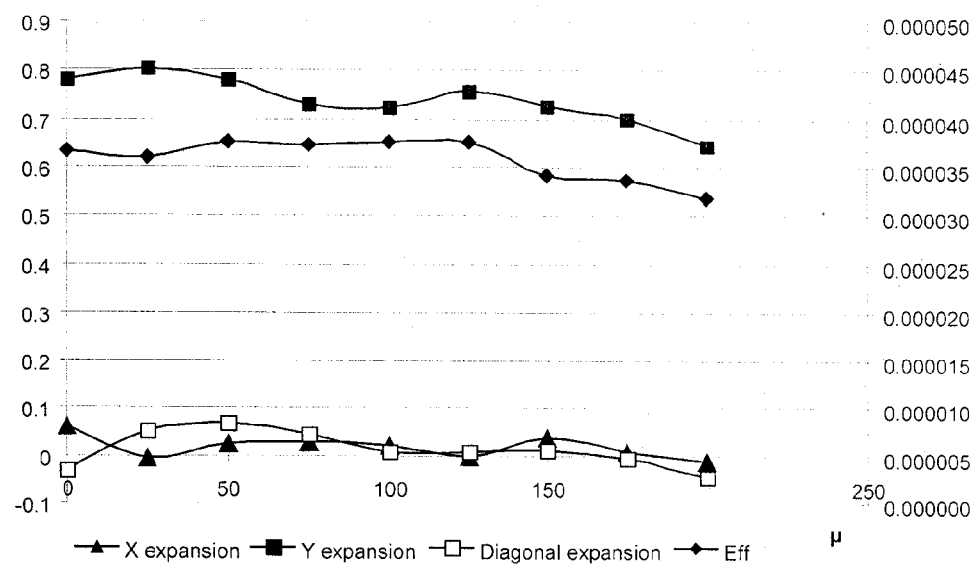
Figure 19A:
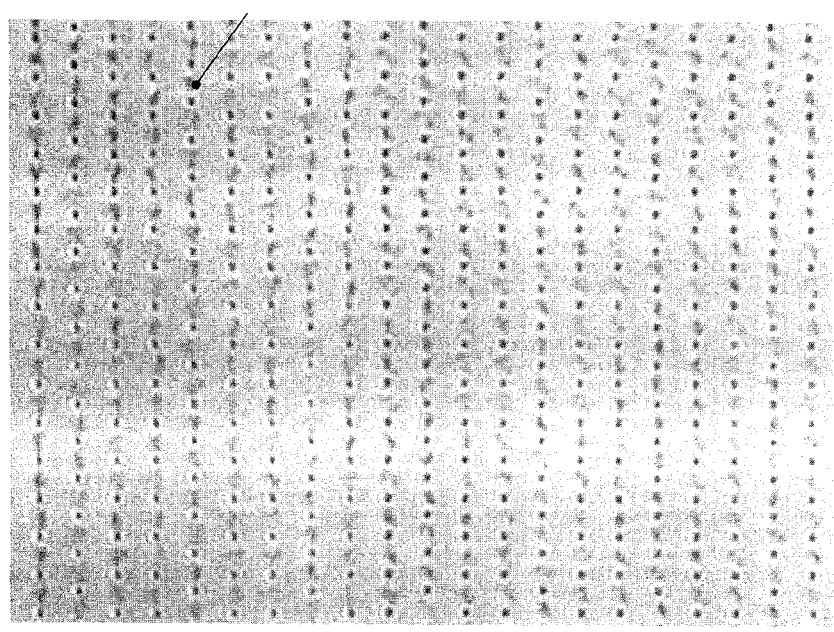
Figure 19B:
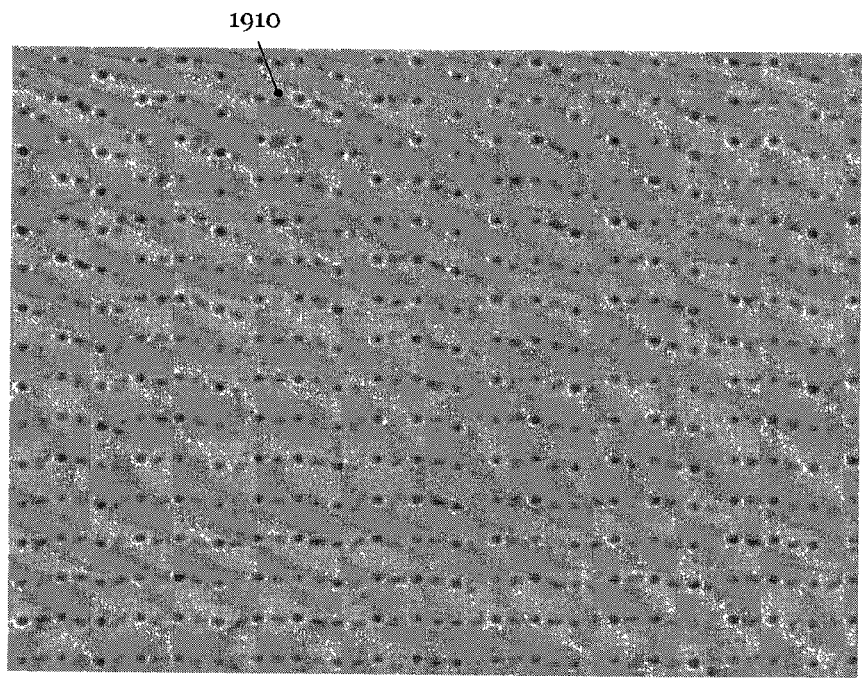
Figure 20:
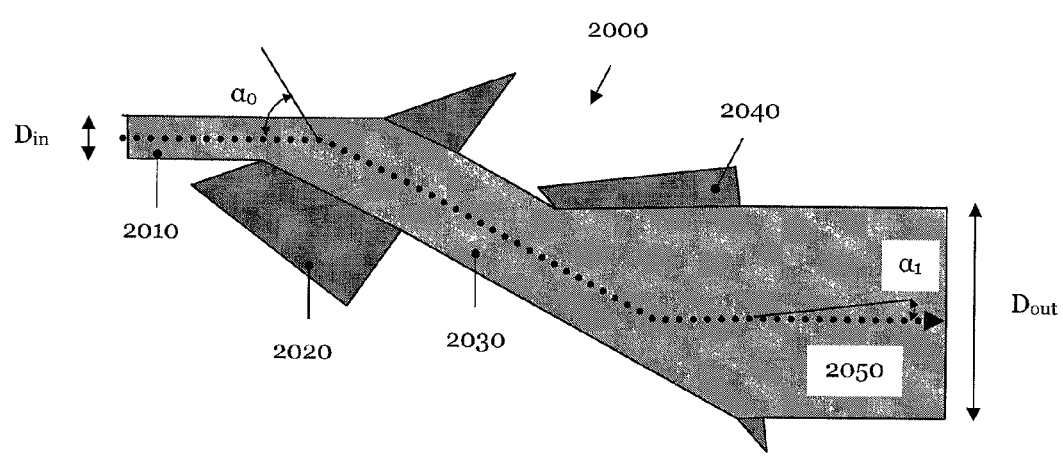
Figure 21:
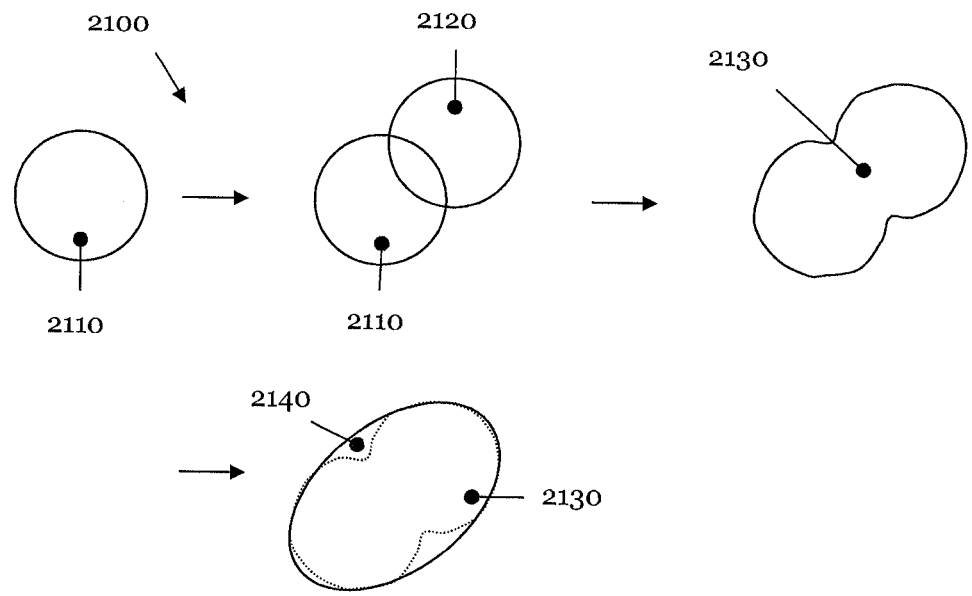
Figure 22:
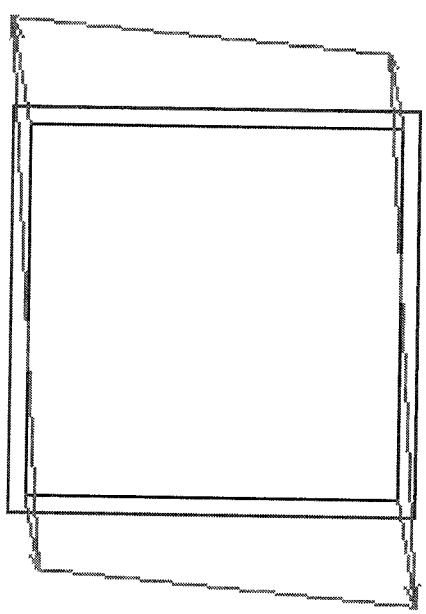
Figure 23A:
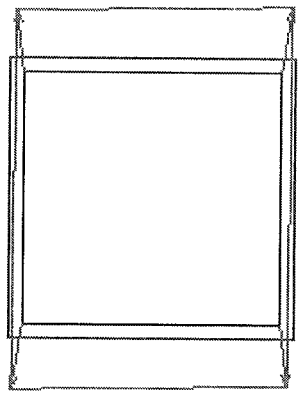
Figure 23B:
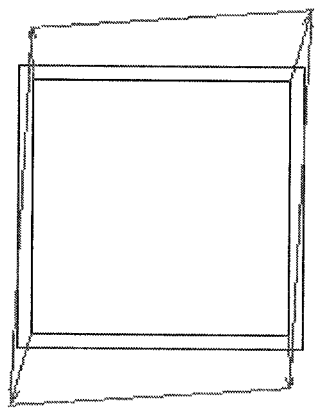
Figure 23C:
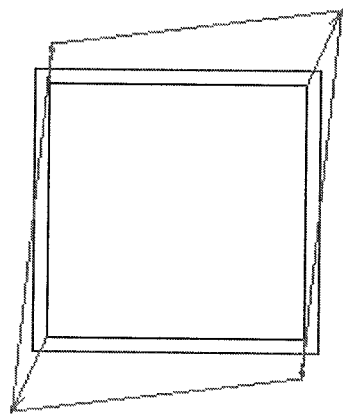
Figure 23D:
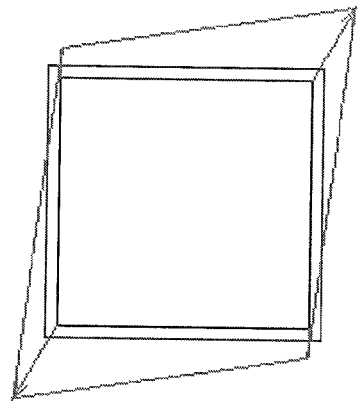
Figure 23E:
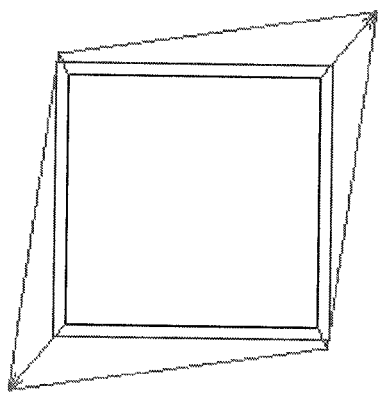
Figure 23F:
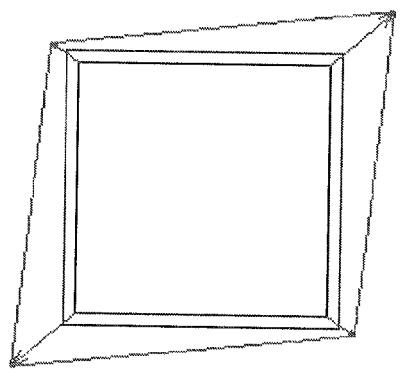
Figure 23G:
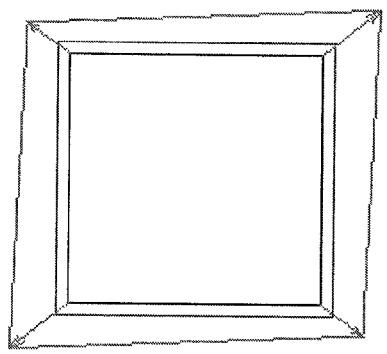
Figure 23H:
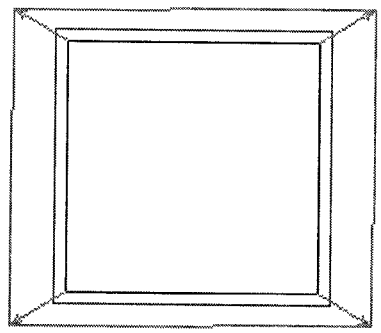
Figure 24:
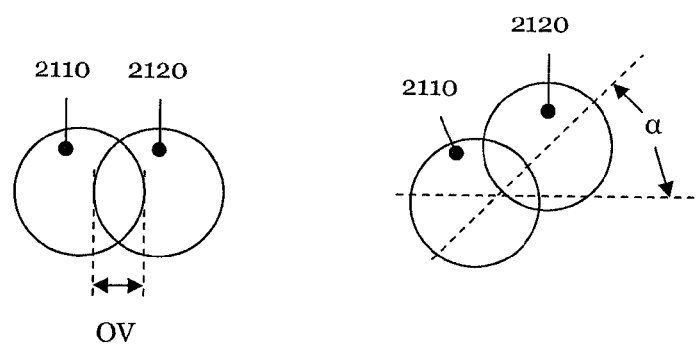
Figure 25:
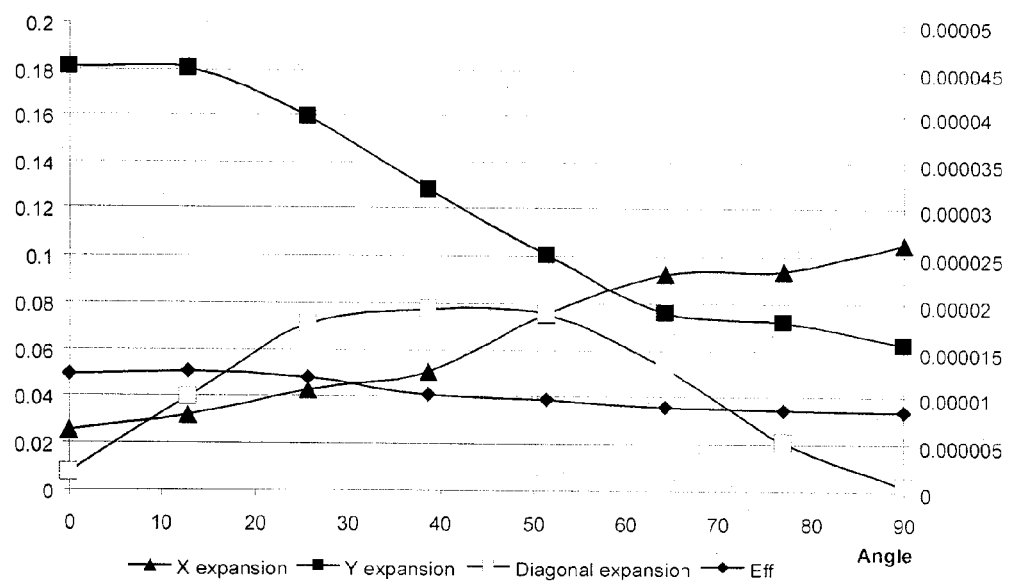
Figure 26:
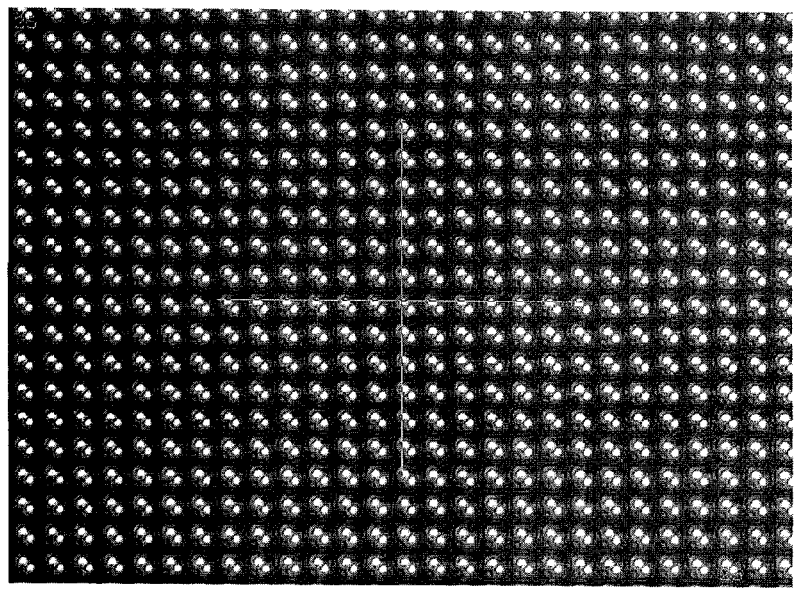
Figure 27A:
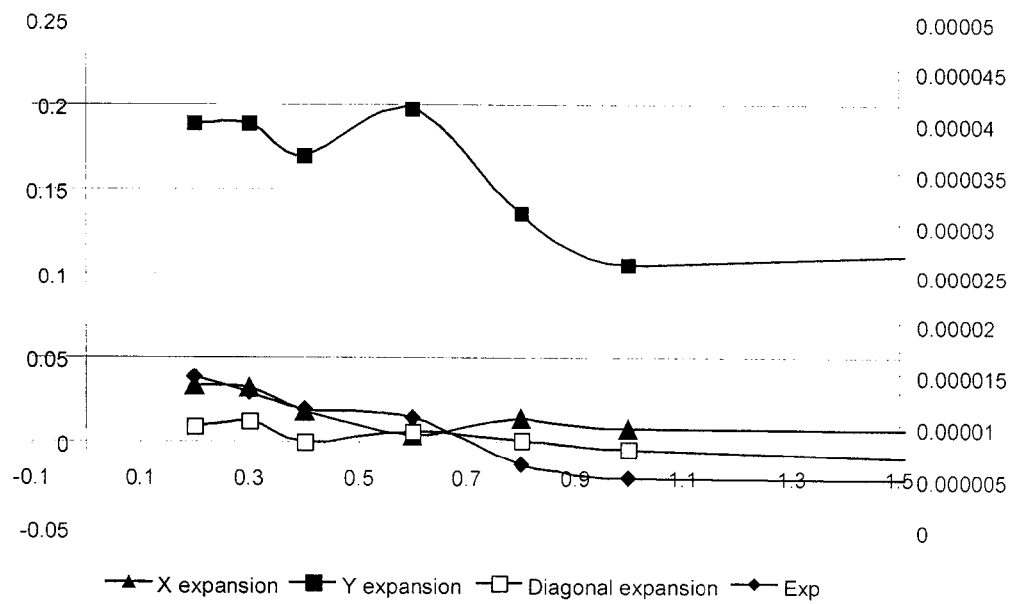
Figure 27B:
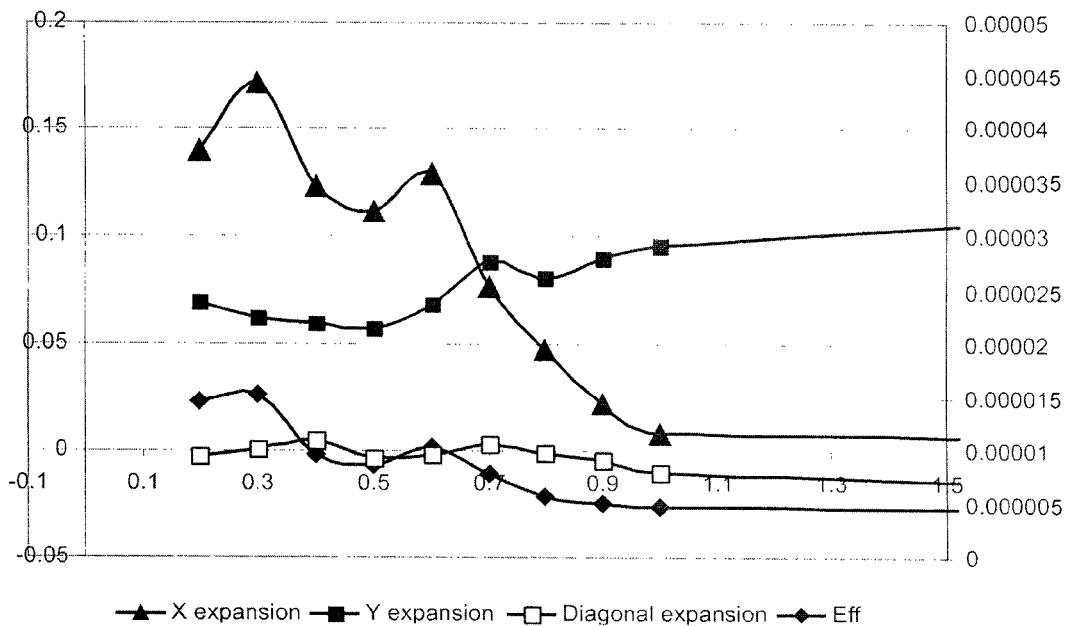
Figure 28:
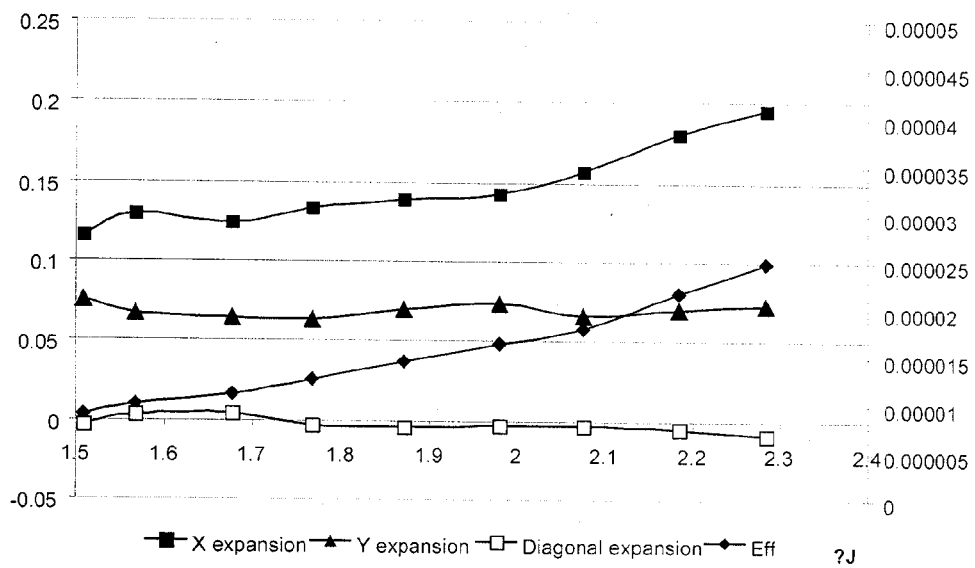
Figure 29:
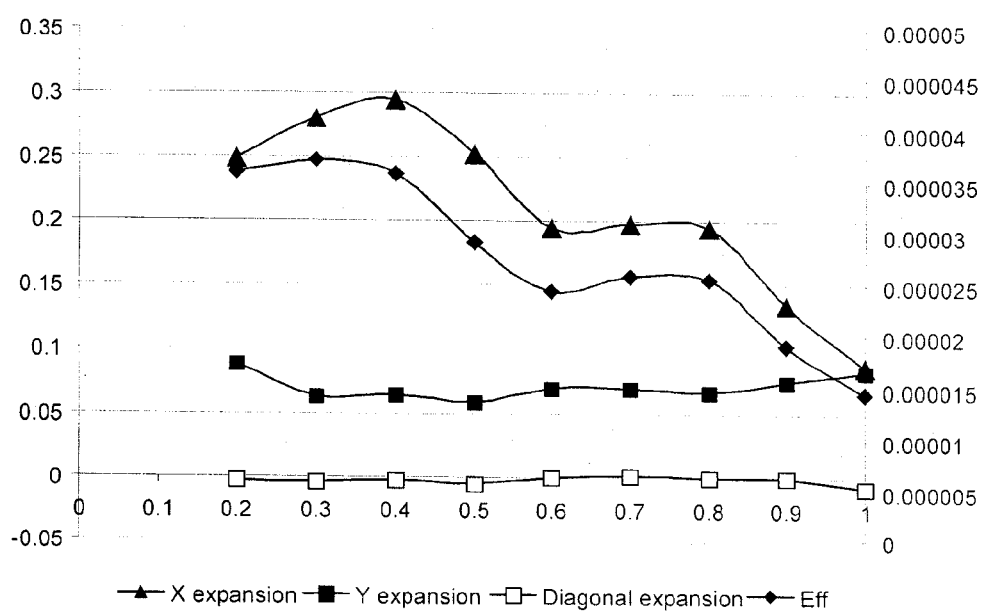
Figure 30A:
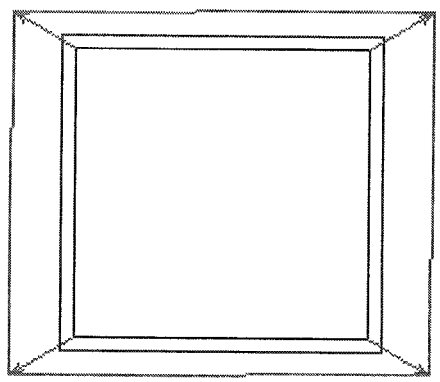
Figure 30B:
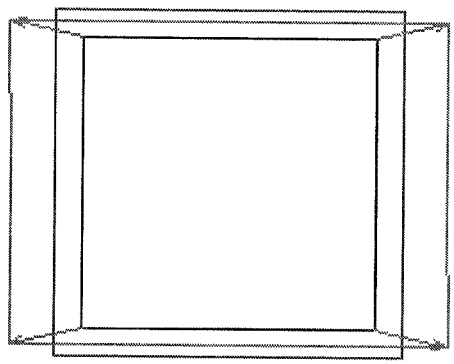
Figure 31:
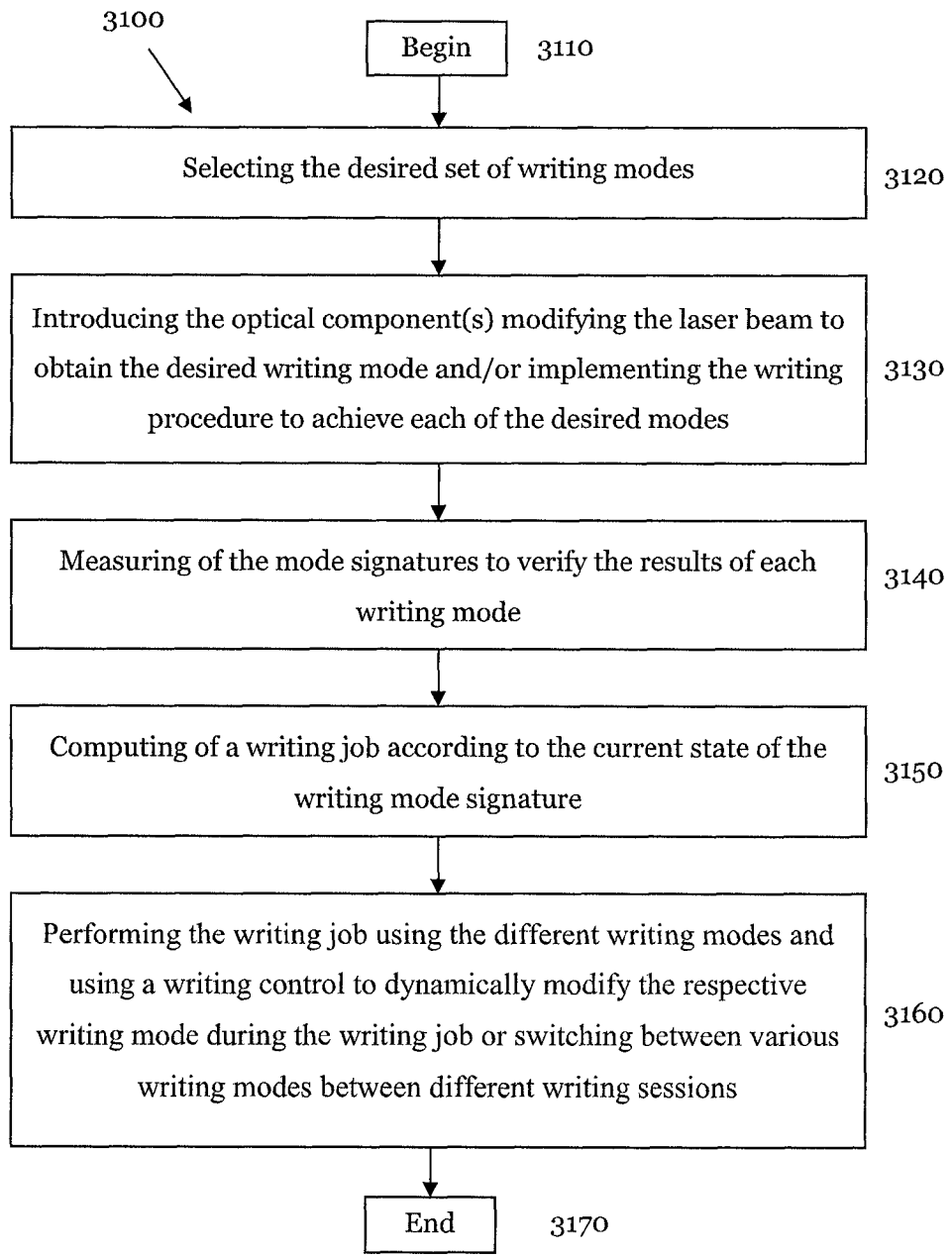

FIG. 3 schematically depicts a cross-sectional view of a template used in the nanoimprint lithography;

FIG. 4 schematically represents a block diagram of an apparatus for the modification of the substrate of the photolithographic masks of FIGS. 1 and 2 and the template of FIG. 3;

FIG. 5 graphically presents a mode signature of a laser beam having a linear polarization in the y (90°) direction;

FIG. 6 graphically illustrate a mode signature of a laser beam having a linear polarization in the x (0°) direction;

FIG. 7 graphically depicts a mode signature of a laser beam having a linear polarization in the xy (45°) direction;

FIG. 8 graphically shows a mode signature of a laser beam having a circular polarization;

FIG. 9 represents a top view of a cut-out of a mask substrate having pixels which are induced in a mask substrate with a circularly polarized laser beam;

FIG. 10 shows a test map used to calculate a CD correction;

FIG. 11*a* indicates the induced registration change (S/O removed) for the CDC test map of FIG. 10 when using a linearly polarized laser beam, wherein the polarization is parallel to the x direction;

FIG. 11*b* depicts the induced registration change (S/O removed) for the CDC test map of FIG. 10 when using a linearly polarized laser beam, wherein the polarization is parallel to the y direction;

FIG. 11*c* represents the induced registration change (S/O removed) for the CDC test map of FIG. 10 when using a circularly polarized laser beam;

FIG. 12 schematically illustrates the generation of an astigmatic laser beam with a cylindrical lens and the beam path to the optical element;

FIG. 13a shows the mode signature of the astigmatic beam of FIG. 12, wherein the cylindrical lens is vertically oriented;

FIG. 13b depicts the mode signature of the astigmatic beam of FIG. 12, wherein the cylindrical lens is horizontally oriented;

FIG. 13c represents the mode signature of the astigmatic beam of FIG. 12, wherein the cylindrical lens is diagonally oriented;

FIG. 14a represents a top view of a cut-out of the optical element having pixels which are generated by the mode signature of FIG. 13a;

FIG. 14b shows a top view of a cut-out of the optical element having pixels which are generated by the mode signature of FIG. 13b;

FIG. 14c presents a top view of a cut-out of the optical element having pixels which are generated by the mode signature of FIG. 13c;

FIG. 15 shows the magnitude of the mode signature as a function of a clipping of the laser beam in the x direction;

FIG. 16 schematically illustrates the generation of a clipped laser beam with a slit and the beam path to the optical element;

FIG. 17a represents the magnitude of the mode signature as a function of the clipping level realized by a slit, wherein the slit is parallel to the beam polarization;

FIG. 17b depicts the magnitude of the mode signature as a function of the clipping level realized by a slit, wherein the slit is perpendicular to the beam polarization;

FIG. 18 presents the variation of the mode signature as a function of the slit displacement in the x direction;

FIG. 19a shows a top view of a cut-out of the optical element having pixels which are induced by a clipped laser beam, wherein a horizontally oriented slit generates the clipped laser beam;

FIG. 19b depicts a top view of a cut-out of the optical element having pixels which are induced by a clipped laser beam, wherein a vertically oriented slit generates the clipped laser beam;

FIG. 20 schematically represents a beam shaping configuration comprising two prisms;

FIG. 21 schematically illustrates the formation of a resulting pixel in a pixel dubbing process and a comparison of the resulting pixel with a predefined deformation form;

FIG. 22 graphically presents a mode signature of a laser beam having a parameter set of the standard process window without pixel dubbing;

FIG. 23a-h depicts the variation of the mode signature for a pixel resulting from a pixel dubbing process as a function of the overlapping angle;

FIG. 24 schematically represents the definition of the quantities overlap value and overlap angle;

FIG. 25 summarizes the data of FIGS. 23a-23h;

FIG. 26 shows a top view of a cut-out of the optical element having pixels resulting from a pixel dubbing process with an overlap angle of 135°;

FIG. 27a presents the variation of the mode signature for pixels resulting from a pixel dubbing process as a function of the overlap value, wherein the overlap varies in the x direction for a pulse energy of 1.5 μJ;

FIG. 27b shows the variation of the mode signature for pixels resulting from a pixel dubbing process as a function of the overlap value, wherein the overlap varies in the y direction for a pulse energy of 1.5 μJ;

FIG. 28 depicts the variation of the mode signature for pixels resulting from a pixel dubbing process as a function of the pulse power for an overlap value of 0.6 μm;

FIG. 29 represents the variation of the mode signature for pixels resulting from a pixel dubbing process as a function of the overlap value, wherein the overlap varies in the y direction for a pulse energy of 2.3 μJ;

FIG. 30a shows a mode signature for pixels resulting from a pixel dubbing process with an overlap angle of 90° prior to the optimization of the pulse energy and the overlay value;

FIG. 30b shows a mode signature for pixels resulting from a pixel dubbing process with an overlap angle of 90° after the optimization of the pulse energy and the overlay value; and FIG. 31 represents a flow chart summarizing an error correction process.

5. DETAILED DESCRIPTION OF PREFERRED EMBODIMENTS

This part of the specification is organized as follows: It begins with the introduction of an embodiment of an apparatus used for locally deforming the optical element and then introduces the term mode signature ("laser system and mode signature"). In the second part entitled "Control of beam polarization and/or beam shaping" a method is then applied in order to control the deformation locally induced in the optical element, i.e. the mode signature. A third part entitled "Pixel interaction" discusses a pixel dubbing process in order to control the mode signature of a pixel by resulting from the introduction of at least two closely spaced laser pulses. The specification ends with a short summary.

5.1 Laser System and Mode Signature

In the following, the present invention will be more fully described hereinafter with reference to the accompanying figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

FIG. 1 represents a schematic cross-sectional view of a transmissive photolithographic mask 100. The mask 100 comprises a substrate 110 having a first or front surface 130 and a second or rear surface 140. The substrate 110 has to be transparent for the wavelength used for the illumination of the photoresist on a wafer. The exposure wavelength may be in the deep ultraviolet (DUV) spectral range of the electromagnetic spectrum, in particular around 193 nm. The substrate material comprises typically quartz. The substrate has typical lateral dimensions of 152 mm×152 mm and a thickness or height of essentially 6.35 mm. The substrate 110 of the photolithographic mask 100 has on its front surface 130 pattern elements 120 normally fabricated from chromium which form on the photoresist the predetermined structure elements from which semiconductor devices are produced. The portion of the substrate 110 of the photolithographic mask 100 carrying pattern elements 120 is called active area 150 of the mask, whereas the boundary portion which does not have pattern elements 120 is called non-active area 160. A laser beam at the exposure wavelength illuminates the substrate 110 of the mask 100 through the second or rear surface 140 of the substrate 110.

FIG. 2 shows a schematic cross-sectional view of a reflective photolithographic mask 200 for a future use in the extreme ultraviolet (EUV) spectral range of the electromagnetic spectrum, in particular for an exposure wavelength of about 13.5 nm. Different from the photolithographic mask 100 of FIG. 1, the mask 200 is a reflective optical element based on a multi-layer mirror structure 205. The multi-layer mirror system 205 of the photolithographic mask 200 is deposited on a front substrate surface 215 of a suitable substrate 210, such as fused silica substrate. Other transparent dielectrics, glass materials or semiconducting materials may also be applied as substrates for EUV photolithographic masks, as for example ZERODUR®, ULE® or CLEARCERAM®.

The multi-layer mirror system 205 comprises in the example presented in FIG. 2 preferably 40 pairs of alternating molybdenum (Mo) 220 and silicon (Si) layers 225. In the example of FIG. 2, the thickness of each Mo layer 220 is 4.15 nm and that of the Si layer 225 amounts to 2.80 nm. In order to protect the multi-layer structure 205, a capping layer 230, for example of silicon with a native oxide of 7 nm depth is arranged on top of the structure. In the multi-layer mirror system 205, the Mo layers 220 act as scattering layers, whereas the silicon layers 225 function as separation layers. Instead of molybdenum other elements with a large atomic number, in particular transition elements can be used as for example cobalt (Co), nickel (Ni), rhenium (Re) and/or iridium (Ir).

The photolithographic mask 200 has on the multi-layer system 205, a capping layer 230 of silicon, a buffer structure 235 and an absorbing structure 240 as pattern elements. Possible materials for a buffer layer 235 are for example fused silica ($SiO_2$), silicion oxygen nitride (SiON), ruthenium (Ru), chromium (Cr), titanium nitride (TiN) and/or tantalum nadir (TaN).

Additionally, an anti-reflective (AR) coating 245 may be applied on the absorbing structure 240 to secure that essentially no EUV photons are reflected. An AR layer 245 can for example comprise tantalum oxynitrid (TaON). EUV photons 250 which incident on the absorbing structure are essentially absorbed, whereas the majority of the EUV photons 250 striking on the capping layer 230 arranged on the multi-layer mirror system 205 are reflected as photons 255.

FIG. 3 schematically illustrates a configuration 300 of a template 310 used in the nanoimprint lithography to transfer pattern elements onto a wafer. The template 310 comprises a material which is transparent in the UV and DUV spectral range, often fused silica is used as a template material. The pattern elements 320 on the front side 330 of the template 310 are fabricated in a process which is very similar to the fabrication of the pattern elements 120 of the photolithographic mask 100 of FIG. 1. Thus, the inventive principle can also be applied to correct various kinds of errors of a template 310 used in the nanoimprint lithography. The template 310 is illuminated by electromagnetic radiation 350 through the template rear side 340.

FIG. 4 depicts a schematic block diagram of an apparatus 400 which can be used to correct errors of the photolithographic masks 100 and 200 of FIGS. 1 and 2 as well as of the template 310 of FIG. 3. The apparatus 400 comprises a chuck 420 which may be movable in three dimensions. The photolithographic mask 410 may be fixed to the chuck 420 by using various techniques as for example clamping. The photolithographic mask 410 may be the photolithographic mask 100 or 200 mounted upside down, so that its rear substrate surface 140 or 240 is directed towards the objective 440, or it may be the template 310 of FIG. 3.

The apparatus 400 includes a pulse laser source 430 which produces a beam or a light beam 435 of pulses or laser pulses. The laser source 430 generates light pulses or laser pulses of a variable duration. The pulse duration may be as low as 10 fs but may also be continuously increased up to 100 ps. The pulse energy of the light pulses generated by the pulsed laser source 430 can also be adjusted across a huge range reaching from 0.01 µJ per pulse up to 10 mJ per pulse. Further, the repetition rate of the laser pulses comprises the range from 1 Hz to 100 MHz. In a preferred embodiment the light pulses may be generated by a Ti:Sapphire laser operating at a wavelength of 800 nm. However, the methods described in the following are not limited to this laser type, principally all laser types may be used having a photon energy which is smaller than the band gap to the substrate of the photolithographic mask 410 and which are able to generate pulses with durations in the femtosecond range. Therefore, for example Nd-YAG laser or dye laser systems may also be applied.

The apparatus 400 may also comprise more than one pulse laser sources 430 (not shown in FIG. 4).

The following table represents an overview of laser beam parameters of a frequency-doubled Nd-YAG laser system which is used in one aspect for locally deforming an optical element.

TABLE 1

Numerical values of selected laser beam parameters for a Nd-YAG laser system
Overview

| Parameter | Numerical value | Unit |
| --- | --- | --- |
| Pulse energy | 0.05-5 | µJ |
| Pulse length | 0.05-100 | ps |
| Repetition rate | 1-10 000 | kHz |
| Pulse density | 1000-10 000 000 | $mm^{-2}$ |
| NA | 0.1-0.9 | |
| Wavelength | 532 | nm |

The following tables indicate parameters for differently influencing the density and/or the optical transmission distribution of the substrate 110, 210 of the photolithographic masks 100 and 200 and of the template 310. Table 2 presents parameters of a frequency-doubled Nd-YAG laser system for a mode of introducing or writing pixels called standard process window (std PW).

TABLE 2

Numerical values of selected laser beam parameters for a Nd-YAG laser system for a standard process window
Std PW (standard process window)

| Parameter | Numerical value | Unit |
| --- | --- | --- |
| Pulse energy | 0.45 | µJ |
| Pulse length | 8 | ps |
| Repetition rate | 50 000 | kHz |
| Pulse density | 1 000-100 000 | $mm^{-2}$ |
| NA | 0.3 | |
| Wavelength | 532 | nm |

Table 3 summarizes parameters of a mode called low registration process window (LowReg PW) again of an embodiment using a frequency-doubled Nd-YAG laser system. This operation mode of the laser system 430 uses light pulses having a lower energy than the std PW, but introduces a higher pixel density.

TABLE 3

Numerical values of selected laser beam parameters for a Nd-YAG laser system for a low registration process window (LowReg PW)
Low Reg PW (low registration process window)

| Parameter | Numerical value | Unit |
| --- | --- | --- |
| Pulse energy | 0.32 | µJ |
| Pulse length | 8 | ps |
| Repetition rate | 50 000 | kHz |
| Pulse density | 5 000-500 000 | mm$^{-2}$ |
| NA | 0.3 | |
| Wavelength | 532 | nm |

The steering mirror or steering system 490 directs the pulsed laser beam 435 into the focusing objective 440. The objective 440 focuses the pulsed laser beam 435 through the rear substrate surface into the substrate of the photolithographic mask 410. The NA (numerical aperture) of the applied objectives 440 depends on the predetermined spot size of the focal point and the position of the focal point within the substrate of the photolithographic mask 410 relative to the rear substrate surface. As indicated in table 1, the NA of the objective 400 may be up to 0.9 which results in a focal point spot diameter of essentially 1 µm and a maximum intensity of essentially $10^{20}$ W/cm$^2$.

The apparatus 400 also includes a controller 480 and a computer system 460 which manage the translations of the two-axis positioning stage of the sample holder 420 in the plane of the x and the y direction. The controller 480 and the computer system 460 also control the translation of the objective 440 perpendicular to the plane of the chuck 420 (z direction) via the one-axis positioning stage 450 to which the objective 440 is fixed. It should be noted that in other embodiments of the apparatus 400 the chuck 420 may be equipped with a three-axis positioning system in order to move the photolithographic mask 410 to the target location and the objective 440 may be fixed, or the chuck 420 may be fixed and the objective 440 may be moveable in three dimensions. It should be further noted that a manual positioning stages can also be used for the movement of the photolithographic mask 410 to the target location of the pulsed laser beam 435 in the x, the y and the z direction and/or the objective 440 may have manual positioning stages for a movement in three dimensions.

The computer system 460 may be a microprocessor, a general purpose processor, a special purpose processor, a CPU (central processing unit), a GPU (graphic processing unit), or the like. It may be arranged in the controller 480, or may be a separate unit such as a PC (personal computer), a workstation, a mainframe, etc. The computer system 460 may further comprise I/O (input/output) units like a keyboard, a touchpad, a mouse, a video/graphic display, a printer, etc. In addition, the computer 460 may also comprise a volatile and/or a non-volatile memory. The computer system 460 may be realized in hardware, software, firmware, or any combination thereof. Moreover, the computer system 460 may control the laser source 430 (not indicated in FIG. 4).

Further, the apparatus 400 may also provide a viewing system including a CCD (charge-coupled device) camera 465 which receives light from an illumination source arranged to the chuck 420 via the dichroic mirror 445. The viewing system facilitates navigation of the photolithographic mask 410 with respect to the target position. Further, the viewing system may also be used to observe the formation of a modified area on the rear substrate surface of the photolithographic mask 410 by the pulse laser beam 435 of the light source 430.

In the following various errors or defects are discussed on the basis of the transmissive photolithographic mask 100 of FIG. 1. It will be appreciated that this discussion can be adapted to the reflective photolithographic mask 200 of FIG. 2 and to the template 310 of FIG. 3

A variation of the optical transmission across the area of the photolithographic mask leads to a corresponding variation of the local optical dose applied to the photoresist on the wafer. The variation of the locally applied dose results in a fluctuation or a variation of the structure dimension of a pattern element in the developed photoresist. The uniformity of a structure element across the area of the photolithographic mask is called critical dimension uniformity (CDU).

Moreover, photolithographic masks may also have placement errors of pattern elements, i.e. some of the pattern elements do not image the pattern parameters exactly at the predetermined position on the photoresist. Placement errors are also called registration errors. Placement errors as well as errors introduced by the scanner used for the illumination of a photolithographic mask and process errors are summarized under the term image placement errors. Relative image placement errors of two or more mask layers form overlay errors.

The effects of image placement errors of pattern elements in the photoresist are normally reduced by performing a linear imaging transformation of the photolithographic mask with respect to the focus of the image field.

In the following, one set of laser beam parameters characterizing a specific laser pulse is also called a writing mode, as the laser beam is focused into the mask substrate and laser pulses are "written" into the substrate of the photolithographic mask 410. Each set of laser beam or laser pulse parameters or each writing mode induces a local deformation in the mask substrate which is characteristic or specific for this parameter set. In other words, each parameter set for a laser pulse or each writing mode generates its specific mode signature in the substrate of the photolithographic mask 410.

The CD variations are typically characterized by their standard deviation σ, in particular their 3σ value. The distribution of the registration errors across the active area 150 of the photolithographic mask 100 is normally illustrated by a two-dimensional (2D) map of arrows, wherein the arrow direction indicates the direction in which a pattern element is shifted with respect to its nominal position and the length of the arrows indicates the amount of the shift.

The laser beam 435 of the laser system 430 is used to locally deform the optical element. As already mentioned, the small local deformations are called pixels. The local deformations modify the density and/or the optical transmission of the substrate material. The introduction of the small local deformations by writing an arrangement of pixels is used to correct the mask defects or errors described above. Therefore, it is essential to know which writing mode or set of laser beam parameters generates which type of pixel. As a distribution of the registration errors across the active area 150 of the photolithographic mask 100 is described as a 2D map, the symmetry or unbalance of the respective pixel type has be known and controlled in detail in order to be able to correct registration errors.

The effect of a laser pulse on the optical element 100, 200, 310 is in the following described in form of a parameter called mode signature (MS). In this concept, the area of the optical element 100, 200, 310 is divided into small elementary areas, preferably small rectangles or squares. The mode signature describes the distortion of an elementary area due to the action of a laser pulse or a sum of laser pulses.

FIG. 5 illustrates the mode signature (MS) 500 for a laser beam 435 having a parameter set or a writing mode within the low registration process window (LowReg PW). Table 3 presents a parameter set for the LowReg PW. The inner black square 520 depicts an elementary area 510 of a mask substrate prior to the application of at least one laser pulse. The outer black square 530 represents the absolute value of the induced deformation. This quantity is indicated in order to compare the deformation magnitudes induced by different laser beam parameter sets or writing modes. The gray rectangle 540 shows the kind of distortion induced by the laser beam in the mask substrate.

5.2 Control of Beam Polarization and/or Beam Shaping

In order to correct an optical transmission variation and also for some registration error, it is necessary to have a process window which generates mode signatures having a distortion magnitude 530 as small as possible. Because in most of the cases a registration error is qualified by the maximum out of the x and of the y placement deviation, a mode signature (MS) is looked for which generates the minimum deformation of the x and the y direction. This allows decreasing the deformation in the direction that gives the maximum placement deviation even on the expense of the other direction. This can be done until the symmetric case is reached where the x and the y directions have essentially the same registration error.

In this context, the term laser beam symmetry mean rotational symmetry with respect to the beam direction. A beam is rotationally symmetric if it is not possible to distinguish between different rotations of the beam. This means physically that the beam has a circular polarization, or it is depolarized with no astigmatism but having a spherically symmetric intensity profile.

The beam symmetry and the deformation symmetry are connected. It is not possible to create an asymmetric deformation with a rotationally symmetric beam. Further, a resulting location deformation is called rotationally symmetric if it is characterized by a strain tensor which is proportional to the unity matrix.

Based on physical considerations, it is clear that a perfectly symmetric pixel can only induce a symmetric deformation. However, even when using a perfectly adjusted optics and a laser beam operating in $TEM_{\infty}$ mode, a well pronounced anisotropy or unbalance of the resulting induced deformation is observed. This situation in indicated in FIG. 5. As can be seen from FIG. 5, although the writing beam intensity profile is rotationally symmetric, it induces mainly an expansion in the y (or 90°) direction.

It is not physically feasible to assume that a minor asymmetry of a local deformation or of a pixel results in a strong anisotropy of the deformation. The asymmetry or unbalance of the mode signature of FIG. 5 definitely shows that the pixels inducing this unbalance are not symmetric. Thus, it can be concluded that the laser beam is also not symmetric.

The only plausible reason for the asymmetry of the mode signature of FIG. 5 is that the laser beam has a distinct polarization. The laser system 430 of FIG. 4 has in its standard configuration a vertical polarization.

The polarization of the laser beam 435 used for the writing of the pixels can be adjusted by introducing a half wave plate. A half wave plate is an example of the dashed optical component 470 of FIG. 4. It is preferred to use a zero order half wave plate, as it has a minor impact on the laser beam 435 and a minimum absorption. FIG. 6 indicates the mode signature of FIG. 5 when the beam polarization is rotated by 90° (gray rectangle), i.e. the laser beam 435 has a polarization in the x (0°) direction. The deformation of the elementary area 510 of FIG. 5 is also rotated by 90°, whereas the polarization change does not modify the absolute magnitude 530 of the deformation.

FIG. 7 shows the mode signature which results in case the laser beam 435 is rotated by 45° with respect to the polarizations of FIGS. 5 and 6. It is clearly seen from FIG. 7 that there is again no effect on deformation magnitude 530 and that the resulting MS follows the orientation of the laser beam 435 or the writing beam polarization.

FIGS. 5 to 7 demonstrate that a half wave plate can be used for controlling the mode signature, i.e. for controlling the orientation of the resulting deformation. However, it has to be noted that the high ratio of the deformations in the two orthogonal directions becomes worse when increasing the pulse power of the laser 435. In other words, if it is necessary to obtain a higher deformation per single laser pulse, an increase of the pulse power will lead to a less pronounced asymmetry or unbalance of the MS. Thus, it will be less effective to control the orientation of the beam polarization by using a half wave plate.

From FIGS. 5 to 7 is can also be concluded that a laser beam 435 having a circular or an elliptical polarization should result in pixels in a mask substrate having an almost symmetric mode signature. FIG. 8 shows the mode signature of the laser beam 435 of FIG. 5 which has a circular polarization. As expected, the mode signature of a circularly polarized beam is more symmetric than that of FIGS. 5 to 7. Moreover, an even more symmetric mode signature can probably be obtained when using an elliptically polarized laser beam 435. Further, the deformation magnitude is again not changed by the optical element 470 which is in the case of the example of FIG. 8 a quarter wave plate. For the same reasons explained above a zero order quarter wave plate is preferred.

FIG. 9 shows a cut-out of a mask substrate goo having pixels 910 which are generated with a circularly polarized laser beam 435 having the mode signature indicated in FIG. 8. It is clearly seen that the pixels 910 have a circular form. FIG. 9 depicts diffraction disks 920 around the pixels 910. The diameter of the pixels is essentially 400 nm. The distance between different pixels 910 in one column is about 7 µm. Further, the distance between the various columns is also approximately 7 µm. The pixels 910 are written with laser beam parameter of the standard process window indicated in Table 3. The data presented in FIG. 9 are obtained by using an AIMS™ system.

In order to demonstrate the effect of a polarization change of the laser beam 435, the registration change induced by the introduction of laser pulses for a critical dimension correction (CDC) is calculated. FIG. 10 illustrates a typical CD correction task. The density of pixels 910 written into the substrate of a photolithographic mask 900 is expressed in percent of the optical transmission variation of the optical intensity used for illuminating the mask 900, or to be more precisely in percent of the attenuation of the illumination caused by the pixels 910 introduced or written in the mask substrate 900. The maximum attenuation allowed by the pixels written for the correction of registration errors is 3%. The mean attenuation of the optical intensity at the illumination wavelength required for the correction of the map of FIG. 10 is 1.39%. As can be seen from FIG. 10 only the active area of the mask is used for the CD correction.

FIGS. 11a-11c represent the induced registration change when the laser beam 435 comprises laser pulses having a linear polarization which is parallel to the x direction (FIG. 11a), which is parallel to the y direction (FIG. 11b) and when the laser pulses are circularly polarized (FIG. 11c). In FIGS. 11a-11c a linear imaging transformation performed by a scanner or a stepper of the lithography system is removed. A linear imaging transformation is typically used to correct a portion of placement errors. A linear imaging transformation is in the following also called a scaling and an orthogonality (S/O) correction.

From FIGS. 11a-11c demonstrate that an x polarization of the writing beam or laser beam 435 induces a higher deformation in the x direction, a polarization in y direction induces a higher deformation in y direction. A circular polarization approximately results in a symmetric deformation. The following table summarizes the resulting placement changes (3σ values) of FIG. 11.

TABLE 4

Placement changes for laser pulses having different polarizations with laser beam parameters of a standard process window (std PW)

| Polarization of the laser beam 435 | 3σ placement change in x direction [nm] | 3σ placement change in x direction [nm] | Maximum of x and y placement change [nm] |
| --- | --- | --- | --- |
| Linear Y | 0.8 | 2.2 | 2.2 |
| Linear X | 2.3 | 0.8 | 2.3 |
| Circular | 0.72 | 1.3 | 1.3 |

Table 4 indicates that a circular polarization of the writing beam or of the laser beam 435 results in a much smaller placement change (−45%) due to a symmetric mode signature (FIG. 8) compared to a linear polarization (FIGS. 5-7).

An astigmatic laser beam leads in the area of the focal waist to a very anisotropic distribution of the optical intensity. It is assumed that the anisotropic intensity distribution of the laser beam may affect symmetry or unbalance of the resulting local deformation or of the resulting pixel, and hence may result in an anisotropy of the deformation of the optical element. A simple control of the astigmatism of the laser beam 435 can be performed by introducing a cylindrical lens in the beam path of the laser beam 435. In this embodiment, the dashed optical component 470 in the laser system 400 of FIG. 4 is a cylindrical lens.

The configuration 1200 of FIG. 12 schematically illustrates the beam path of the laser beam 435 of FIG. 4. The rotationally symmetric laser beam 1210 passes the cylindrical lens 1220 which introduces an astigmatism. The astigmatic beam 1230 passes the steering system 1240 which is equivalent to the steering mirror 490 of FIG. 4. The objective 1250 focus the laser beam 1230 in the optical element 1260 and the laser pulses of the laser beam 1230 generate local deformations or pixels 1270 in the optical element 1260. The focal distance of the laser system 400 is about 10 mm. The NA of the objective 1250 is about 0.4 in the example depicted in FIG. 12. In order to provide an aspect ratio of 1:2 for the spot at the focal waist, a cylindrical lens with focal length about 20 mm is required. For the experimental data described in the following Figures, a cylindrical lens was used having a focal length of about 10 mm which results in a spot aspect ratio of 1:4.

FIGS. 13a-13c represent the resulting mode signatures for various orientations of the cylindrical lens 1220. Similar to the FIGS. 5-8, the inner black square represents an undisturbed elementary area of an optical element 100, 200, 310. The outer black square represents the magnitude or the absolute value of the expansion of the material of the optical element 100, 200, 310 induced by the introduction of pixels 1270. The magnitude of the material expansion/contraction by an astigmatic beam is much higher than for a polarization controlled beam. This effect is very beneficial for a correction of placement or registration errors within the active area of the optical element 100, 200, 310 without significantly affecting the transmittance of the optical element 100, 200, 310. The pixel efficiency is five times higher compared to std PW (see Table 4) and 150 higher than for LowRegPW (see Table 3). It reaches an expansion per pixel of 0.0018 nm of a 1 mm square area of the optical element 100, 200, 310.

FIG. 13a shows that an orientation of the cylindrical lens 1230 in which the cylinder axis is parallel to a horizontal orientation leads to an asymmetric mode signature which preferably extends in y direction. Whereas FIG. 13b, where the cylindrical lens 1230 is vertically oriented, results in a predominantly expansion of the elementary area in x direction. A diagonal orientation of the cylindrical lens 1230 which is indicated in FIG. 13c results in an essentially diagonal distortion of the elementary area by the laser pulse.

FIGS. 14a-14c present cut-outs of the optical element 100, 200, 310 in top view showing pixels 1410. Pixels 1410 have a rod shaped form. The orientation of pixels 1410 follows the orientation of the cylindrical lens 1220. For a vertical orientation of the cylinder lens a profile of the pixels is obtained which expands the optical element preferably in the vertical direction.

Another method of controlling the mode signature is beam forming or beam shaping. The simplest way to form an asymmetric shape of the laser beam 435 is to clip it with a blade or with a slit. In the following, the relative amount of the optical intensity blocked by the blade or the slit is taken as a measure of the clipping level of the laser beam 435. If the blade or slit is oriented parallel to the y direction, the laser beam 435 is clipped in the x direction. The clipping in the x direction leads to a greater expansion of the local deformation element or of the pixel in the y direction.

FIG. 15 presents the expansion of the mode signature in the x and the y direction for a laser beam 435 which is clipped by a blade in the y direction. The x-axis denotes the portion of the area of the laser beam 435 which is clipped by the blade. The left y-axis indicates the expansion of the mode signature in nanometer. The right y-axis shows the deformation induced per pixel in the respective direction in relation to an area of 1 mm$^2$ of the optical element 100, 200, 310. Therefore, the unit of the right y-axis is mm$^{-1}$. The right y-axis indicates the pixel efficiency of the writing process. The expansion of the mode signatures in the x and they direction, are presented in FIG. 15, but not the diagonal direction. Moreover, FIG. 15 also gives the effective pixel expansion which is calculated according to the equation ($x_{exp}+y_{exp}$)/Number of pixels.

FIG. 15 indicates that the maximum asymmetry or imbalance of the mode signature occurs at a clipping level of approximately 50%, i.e. when 50% of the optical intensity is blocked blade. The maximum expansion or the maximum mode signature is about 0.7 nm per 1 mm$^2$ area of the optical element 100, 200, 310.

In order to obtain a beam shaping system which is more immune to the beam pointing stability and also from a general symmetry consideration, it is preferable to use a slit for the beam shaping instead of a blade. FIG. 16 illustrates a beam path 1600 of the laser beam 435 wherein the optical component 470 is a slit 1620. The slit 1620 has a variable slit width and the slit can be rotated around the direction of the laser beam 1610 (not shown in FIG. 16). The slit 1620 can realize a symmetric clipping of the laser beam 435. After passing the slit 1620 the laser beam 1630 is directed via the steering system 1640 and the objective 1650 onto the optical element 100, 200, 310 and induces local deformations or pixels 1670.

FIG. 17a summarizes the mode signature as a function of the clipping level. The clipping level is here as well as in the following figures the ratio of the slit width to the diameter of the laser beam 435. In FIG. 17a the slit 1620 is oriented in the y direction. Thus, it clips the laser beam 1630 in the x direction. The laser beam 435 of the example presented in FIG. 17a is linearly polarized and the direction of polarization is parallel to the slit direction. In FIG. 17b, the slit 1620 is rotated by 90° so that it performs a clipping in the y direction and the slit 1620 and the polarization of the laser beam 435 also have an angle of 90°.

As can be seen from FIGS. 17a and 17b, the behaviour of the mode signature depends on the polarization of the clipped laser beam 1630. However, the major portion of the mode signature behaviour is governed by the orientation of the slit 1620. When slit width comes close to the beam size, i.e. for x values>0.7 in FIGS. 17a-17b, there is no significant variation of the MS as a function of the slit width. FIGS. 17a and 17b clearly reveal that a slit width which is around a half or a bit less of the diameter of the laser beam 435 is optimal to influence the form of the local deformation inducing by the laser beam 1630 into the optical element 100, 200, 310. When selecting the slit width as a half of the diameter of the beam size 435, it can be assumed from FIGS. 16, 17a and 17b that the mode signature virtually becomes independent from the diameter of the laser beam 435.

FIG. 18 shows the mode signature behaviour as a function of a slit displacement. The laser beam 1630 in FIG. 18 is clipped in the x direction, i.e. the slit 1620 is oriented in the y direction. The slit width amounts 50% of the diameter of the laser beam 435. The polarization direction of the linearly polarized laser beam 1630 is parallel to the slit 1620.

As can be seen from FIG. 18, the mode signature does not show a significant dependence on the slit displacement. The variation of the mode signature in FIG. 18 is within the measurement repeatability. This means that the clipping method of FIG. 16 is immune to the beam pointing stability and the beam displacement. For the typical beam pointing stability at one meter distance from the laser source, the pulse to pulse and the long term variations of the laser beam are about several microns.

FIG. 19a presents a top view on a cut-out of the optical element 100, 200, 310 having a regular pixel arrangement written with a clipped laser beam 1630. The laser beam 1630 is clipped in the y direction as the slit 1620 is horizontally oriented. FIG. 19b is identical to FIG. 19a beside that the slit 1620 is vertically oriented resulting in a laser beam 1630 which is clipped in the x direction. The form of the pixels 1910 is similar to the clipped laser beam 1620 and follows the orientation of the slit 1620.

The forming or shaping of a laser beam 435 by clipping a portion of the beam is not a preferred method. After the clipping, the laser beam 1630 has after the clipping an unwanted spatial spectrum. Moreover, the propagation and the self-focusing are potentially not stable. There are other methods of beam shaping which provide a more controllable expansion of the laser beam 435. FIG. 20 presents as an example a controllable beam shaping configuration 2000 comprising two prisms 2020 and 2040. An incident beam 2010 having a beam diameter $D_{in}$ is adjustably expanded in the drawing plane by selecting the incidence angle $\alpha_0$ of the first prism 2020. The expansion of the diameter $D_{out}$ of the output beam 2050 is adjusted by the exit angle $\alpha_1$ of the second prism 2040. Thus, by the simultaneous control of the incidence angle $\alpha_0$ and of the exit angle $\alpha_1$, the beam expansion in the plane of the drawing can be adjusted while keeping the direction of the output beam parallel to the direction of the input beam.

The implementation of the method of FIG. 20 is technically more involved than laser beam clipping due to the bulky prisms 2020 and 2040, the additional degrees of freedom introduced in the laser beam 435 and/or the displacement of the laser beam 435. On the other hand, it enables a more stable writing of pixels in the optical elements 100, 200, 310.

5.3 Pixel Interaction

As already mentioned, pixels having a circular form are typically preferred for correcting CD variations across the optical element 100, 200, 310. On the other hand, asymmetric pixels are often useful for the correction of placement errors. Therefore, in order to generate asymmetric local deformations, it is necessary to induce or to write strongly asymmetric pixels in the optical element 100, 200, 310. On the other hand, it is a complex task to provide a laser beam 435 with a beam property that varies on a pulse to pulse basis. Therefore, this application describes another approach that allows the generation of pixels with an adjustable symmetry.

For this purpose, overlapping pixels are written in the optical element 100, 200, 310. The scheme 2100 of FIG. 21 schematically illustrates the writing of a pixel leading to a predefined deformation form 2140. In a first step, a first pixel 2110 is written in an optical element 100, 200, 310. The optical element 100, 200, 310 is not depicted in FIG. 21. In a second step, a second pixel 2120 is written in the optical element 100, 200, 310. In the example presented in FIG. 21, the pixels 2110 and 2120 partially overlap. In an alternative approach, it is also conceivable that the pixels 2110 and 2120 are close to each other but do not overlap.

In FIG. 21, the two pixels 2110 and 2120 form a resulting pixel 2130. The two laser pulses are selected so that resulting pixel 2130 generates a predefined deformation form 2140. This is schematically indicated in the lower part of FIG. 21. This method of writing two overlapping individual pixels is in the following called pixel dubbing. The pixel dubbing procedure makes the pixel generation process non symmetric, because the material of the optical element 100, 200, 310 in the areas of the pixels 2110 and 2120 deformed by the first laser pulse and the second laser is no longer isotropic.

In the example of FIG. 21, the two laser pulses forming the resulting pixel 2130 generate circular pixels 2110 and 2120 having an identical diameter. The described method does not require the application of symmetric individual pixels 2110, 2120. Further, it is also not necessary to use laser pulses for the writing of the first 2110 and the second pixel 2120 having the same parameter set. For example, an arrangement of first pixels 2110 can be written in the optical element 100, 200, 310 in a first step. Then, the laser beam parameters can be readjusted prior to the writing of the arrangement of the second pixels 2120.

In the following examples, the resulting pixels 2130 are obtained by are the method of pixel dubbing. It is appreciated that a resulting pixel 2130 can also be written by using more than two individual pixels 2110, 2120 (not shown in FIG. 21). Moreover, the pixel dubbing method is the following used to induce local deformations in the optical element 100, 200, 310 having a distinct asymmetric form or shape. It is also appreciated that it can also be used to write an essentially circular resulting pixel 2130 from imbalanced individual pixels 2110, 2120 (also not indicated in FIG. 21).

FIG. 22 presents the mode signature for laser pulses having parameters within the standard process window (std PW). Table 2 summarizes the parameters of the standard process window. Pixel dubbing is not used for the mode signature of FIG. 22. Similar to the previous figures, the mode signature of the inner black square is an elementary area of the undistorted optical element 100, 200, 310. The outer black square represents the magnitude of the area change induced by the writing of the pixels 2110, 2120. The grey rectangle illustrates the direction of the changes induced by the laser pulse.

The effect of pixel dubbing is depicted in FIG. 23. The overlap value OV is selected to be 0.5 µm. The measurement sequence of the FIGS. 23a to 23h shows the effect of the variation of the overlap angle α. FIG. 24 illustrates the definitions of the overlap value OV and the overlap angle α.

The result of FIG. 23 clearly shows that the mode signature shape of the resulting pixel 2130 can be easily controlled by the angle α of the overlapping pixels 2110 and 2120.

The data of FIG. 23 are collected in FIG. 25 as a function of the overlapping angle α. The left y-axis shows again the deformation induced per pixels for a square with an area of 1 mm².

FIG. 26 represents a cut-out of the optical element 100, 200, 310 having resulting pixels 2130 generated in the pixel dubbing process described in FIGS. 23 and 25 for an overlap angle α of 135°.

As already mentioned, there are typically at least two different targets for the writing of pixels in the optical element 100, 200, 310. A first target of the pixel writing is to correct a CD variation across the optical element 100, 200, 310 without introducing any degradation of the placement of the absorbing elements on the optical elements 100, 200, 310, i.e. without introducing a registration error. The type of process window (PW) used for the respective mode signature is described in the first part of section 5.2 ("Beam polarization and/or beam shaping").

The second target is to correct registration errors without degrading the critical dimension (CD). This second target requires locally inducing a maximum deformation in the optical element 100, 200, 310 with a minimum attenuation of the optical transmission. This means for the mode signature that is should provide a maximum MS magnitude. The pixel dubbing approach is beneficial as it provides in general at least three further parameters, i.e. three further degrees of freedom for the local deformation induced by the resulting pixel 2130. The parameters for adapting the resulting pixel 2130 to the local predefined deformation form 2140 are: the pulse power, the overlap value OV, and/or the overlap angle α. FIGS. 23 and 25 demonstrate that the overlap angle α can effectively be used for controlling the MS shape. In the next step, a relationship between the pulse power and the overlap value will be defined that results in a maximum MS magnitude and the maximum asymmetry of the mode signature.

FIG. 27a shows the mode signature as a function of the overlap value OV in the x direction, and FIG. 27b illustrates the mode signature as a function of the overlap value OV in the y direction. The energy of the first and the laser pulse is 1.5 µJ.

It can be clearly seen from FIGS. 27a and 27b that the mode signature has a maximum asymmetry at the two overlap distances around 0.3 µm and 0.6 µm. These overlap values OV can be used for the writing of highly asymmetric resulting pixels 2130 with a low dependence of the pixel dubbing process on the pulse to pulse beam pointing stability.

FIG. 28 represents the variation of the mode signature as a function of the energy of the laser pulses. In the example of FIG. 28, the first laser pulse and the second laser pulse generating the resulting pixel 2130 have the same energy. The pulse length is 8 ps and the focus width amounts 0.8 µs. The overlap angle α is 90°, i.e. the second pixel 2120 is oriented in the y direction. The overlap value OV is 0.6 µm and is not changed during the measurement.

FIG. 28 shows a clear trend of an expansion in the x direction with an increase of the pulse power. Therefore, the measurements of the mode signature are repeated for the high pulse energy. These measurements are depicted in FIG. 29. In the experiment of FIG. 29, the pulse power is limited to a pulse power which is half of the power at which signs of a generation of cracks are observed. The pulse energy in FIG. 29 amounts 2.3 µJ. The pulse length is again 8 ps and the focus width is 0.8 µm. FIG. 29 presents the mode signature as a function of the overlap value OV. Similar to FIG. 27, the mode signature shows two maxima, but at overlap values which are different from FIG. 27. At the high pulse energy, an overlap value of 4 µm results in a significantly higher expansion to attenuation value.

FIG. 30a presents the mode signature of a pixel dubbing process prior the optimization of the adjustable parameters. FIG. 30b illustrates the mode signature of a pixel dubbing process after the parameters overlap value and laser energy have been optimized. In both, FIGS. 30a and 30b the overlap angle α are fixed and amounts 90°, i.e. the pixel dubbing is in the y direction.

FIGS. 30a-30b demonstrate that it is possible to increase the MS magnitude and the MS asymmetry by approximately a factor of three by optimizing the laser beam parameters pulse energy and overlap value OV.

FIGS. 22-30 illustrate that a local asymmetric deformation can be easily achieved by the writing of overlapping pixels. Further, the pixel dubbing procedure can also be realized by using a controllable optical pulse splitter in the path of the laser beam 435 (not shown in FIG. 4). In the approach discussed above, the pixel dubbing was performed by using of a fast pixel positioning control, and the method does not require any special optical setup. Therefore, the explained approach realizes a very flexible and simple way of the MS control. On the other hand, due to a nonlinearity of the pixel to pixel interaction, the presented method might be sensitive to the pulse power and pointing stability.

FIG. 31 presents an exemplary flow chart 3100 of an error correction process using various aspects described in this application. The flow chart 3100 begins at 3110 and continues at step 3120 by selecting the desired set of writing modes required for the correction of the errors identified for the optical element 100, 200, 310.

In step 3130, the optical component or the optical components are introduced in the path of the laser beam which modify the laser beam in order to obtain the desired writing mode. In an alternative approach the writing procedure of the laser beam is implemented so that the desired modes are achieved.

Then, in step 3140, the mode signature of each of the writing modes is measured to verify the results of each writing mode.

In step 3150, a writing job is calculated. This is done with to the current state of the writing mode signature. The pixels or the arrangement of pixels which may comprise different writing modes is determined to correct the identified errors of the optical element 100, 200, 310.

Finally, in step 3160, the writing job is actually performed using the different writing modes and using a control of the pixel writing in order to dynamically modify the respective writing mode during the writing job, or by switching between various writing modes between different writing sessions. The method ends at step 3170.

5.4 Summary

The present application demonstrates that a local deformation which is induced by the writing of pixels in an optical element can be controlled by different means. In a first aspect, simple and effective methods of controlling the mode signature of various writing modes are based on the control of the writing beam property. Another approach for controlling the mode signature is to vary the conditions for the writing of different pixels, as for example the writing sequence of the pixels, the dubbing or grouping of pixels, the control of the anisotropy of the written pixels, and others.

The efficiency resulting of the different approaches depends on the target application. For some applications, the only important parameter is the magnitude of the mode signature—actually it is the ratio of the induced local deformation to the induced local attenuation of the transmittance. The maximum deformation obtained per pixel or per writing layer in the optical element are important parameters characterizing the productivity of an error correction process of an optical element. For a precise control of a registration correction process, a high asymmetry of the mode signature may be useful. The various control approaches presented in the present application can provide an optimum result for different targets.

TABLE 5

Summary of different MS (mode signature) control methods presented in the present application

|  | MS mag. | MS ratio | Exp. Eff. [nm] | Max. Exp. [nm/mm] |
|---|---|---|---|---|
| Polarization control | 0.05-0.2 | 2-3 | $6.0 \cdot 10^{-7}$ | 0.4 |
| Pixel dubbing | 0.1-0.4 | 5-6 | $5.0 \cdot 10^{-5}$ | 6 |
| Astigmatism control | 0.2-1.5 | 5-10 | $1.0 \cdot 10^{-4}$ | 10 |
| Shape control | 0.2-2.0 | 10-15 | $3.0 \cdot 10^{-4}$ | 10 |

Abbreviations in Table 5:
MS mag: mode signature magnitude
Exp. Eff.: Pixel expansion efficiency
Max. Exp.: Maximum expansion per layer

The invention claimed is:

1. A method for locally deforming an optical element for photolithography in accordance with a predefined deformation form, the method comprising:
   generating at least one laser pulse having at least one laser beam parameter, wherein the at least one laser beam parameter comprises a polarization of the at least one laser pulse;
   selecting the polarization of the at least one laser pulse to have a first polarization that is selected from a plurality of polarizations, each of the plurality of polarizations being associated with a predefined deformation form of the optical element; and
   directing the at least one laser pulse onto the optical element to locally deform the optical element in accordance with the predefined deformation form associated with the first polarization.

2. The method of claim 1, wherein the first polarization comprises a linear polarization, and wherein the predefined deformation form is essentially parallel to the linear polarization of the at least one laser pulse.

3. The method of claim 1, wherein the first polarization comprises an elliptical polarization, and wherein a predefined elliptical deformation form is essentially aligned to the at least one elliptically polarized laser pulse.

4. The method of claim 1, wherein the first polarization comprises a circular polarization, and wherein the predefined deformation form is an essentially circular deformation form of the optical element.

5. The method of claim 1, wherein a wave plate generates the first polarization of the at least one laser pulse.

6. The method of claim 1, wherein the at least one laser beam parameter comprises an astigmatism of the at least one laser pulse.

7. The method of claim 6, wherein at least one cylindrical lens generates the astigmatism of the at least one laser pulse.

8. The method of claim 1, wherein the at least one laser beam parameter comprises a beam shape of the at least one laser pulse.

9. The method of claim 8, wherein at least one aperture generates the beam shape for the at least one laser pulse.

10. The method of claim 9, wherein the at least one aperture comprises a slit-like aperture with an adjustable width and/or wherein the aperture is rotatable around a beam direction of the at least one laser pulse.

11. The method of claim 8, wherein a prism combination generates the beam shape of the at least one laser pulse.

12. The method of claim 11, wherein the prism combination comprises at least two prisms rotatable around a beam direction of the at least one laser pulse, and wherein a first prism is adjustable with respect to an input beam and/or a second prism is adjustable with respect to an output beam.

13. The method according to claim 1, wherein the optical element comprises a photolithographic mask, a mirror, and/or a template for a nanoimprint lithography.

14. The method according to claim 13, wherein the photolithographic mask comprises a transmissive photolithographic mask having a substrate and an absorbing structure or a reflective photolithographic mask having a substrate, a multilayer structure and an absorbing structure, and wherein the mirror comprises a substrate and a multilayer structure.

15. An apparatus for locally deforming an optical element for photolithography in accordance with a predefined deformation form, comprising:
   a. a light source for generating at least one laser pulse;
   b. an optical component for selecting at least one laser beam parameter of the at least one laser pulse, wherein the at least one laser beam parameter comprises a polarisation of the at least one laser pulse, in which the optical component selects the polarization of the at least one laser pulse to have a first polarization that is selected from a plurality of polarizations, each of the plurality of polarizations being associated with a predefined deformation form of the optical element; and
   c. an objective for directing the at least one laser pulse onto the optical element to locally deform the optical element in accordance with the predefined deformation form associated with the first polarization.

16. The apparatus of claim 15, wherein the apparatus is further adapted to perform:
generating the at least one laser pulse having the at least one laser beam parameter, wherein the at least one laser beam parameter comprises a polarization of the at least one laser pulse, and a direction of the predetermined deformation form is adjusted by the at least one laser pulse; and
directing the at least one laser pulse onto the optical element, wherein the at least one laser beam parameter of the laser pulse is selected to yield the predefined deformation form.

17. The method of claim 1 in which generating at least one laser pulse having at least one laser beam parameter comprises generating a first series of at least one laser pulse having the first polarization, the method further comprising:
generating a second series of at least one laser pulse having a second polarization selected from the plurality of polarizations; and
directing the second series of at least one laser pulse onto the optical element to locally deform the optical element in accordance with the predefined deformation form associated with the second polarization.

18. The apparatus of claim 15 in which the light source is configured to generate a second series of at least one laser pulse, the optical component is configured to select the polarization of the second series of at least one laser pulse to have a second polarization different from the first polarization, and the objective is configured to direct the second series of at least one laser pulse onto the optical element to locally deform the optical element in accordance with the predefined deformation form associated with the second polarization.

19. A method for locally deforming an optical element for photolithography in accordance with a predefined deformation form, the method comprising:
generating at least one laser pulse having at least one laser beam parameter, wherein the at least one laser beam parameter comprises an astigmatism of the at least one laser pulse;
selecting the astigmatism of the at least one laser pulse to have a first type of astigmatism that is selected from a plurality of types of astigmatism, each of the plurality types of astigmatism being associated with a predefined deformation form of the optical element; and
directing the at least one laser pulse onto the optical element to locally deform the optical element in accordance with the predefined deformation form associated with the first type of astigmatism.

20. The method of claim 19 in which generating at least one laser pulse having at least one laser beam parameter comprises generating a first series of at least one laser pulse having the first type of astigmatism, the method further comprising:
generating a second series of at least one laser pulse having a second type of astigmatism selected from the plurality of types of astigmatism; and
directing the second series of at least one laser pulse onto the optical element to locally deform the optical element in accordance with the predefined deformation form associated with the second type of astigmatism.

21. A method for locally deforming an optical element for photolithography in accordance with a predefined deformation form, the method comprising:
generating at least one laser pulse having at least one laser beam parameter, wherein the at least one laser beam parameter comprises a beam shape of the at least one laser pulse;
selecting the beam shape of the at least one laser pulse to have a first astigmatism that is selected from a plurality of beam shapes, each of the plurality of beam shapes being associated with a predefined deformation form of the optical element; and
directing the at least one laser pulse onto the optical element to locally deform the optical element in accordance with the predefined deformation form associated with the first beam shape.

22. The method of claim 21 in which generating at least one laser pulse having at least one laser beam parameter comprises generating a first series of at least one laser pulse having the first beam shape, the method further comprising:
generating a second series of at least one laser pulse having a second beam shape selected from the plurality of beam shapes; and
directing the second series of at least one laser pulse onto the optical element to locally deform the optical element in accordance with the predefined deformation form associated with the second beam shape.

* * * * *

UNITED STATES PATENT AND TRADEMARK OFFICE
CERTIFICATE OF CORRECTION

PATENT NO. : 9,606,444 B2
APPLICATION NO. : 14/238803
DATED : March 28, 2017
INVENTOR(S) : Vladimir Dmitriev and Uri Stern It is certified that error appears in the above-identified patent and that said Letters Patent is hereby corrected as shown below:

In the Specification

Column 4
Line 45, delete "µl to 5 µl" and insert -- µJ to 5 µJ --
Line 49, delete "10×" and insert -- 100× --

Column 7
Line 51, delete "FIG." and insert -- FIGS. --

Column 9
Line 33, delete "silicion" and insert -- silicon --
Line 39, delete "oxynitrid" and insert -- oxynitride --

Column 11
Line 23 (Approx.), delete "400" and insert -- 440 --

Column 12
Line 8, after "3" insert -- . --

Column 15
Lines 27-29 (Approx.), in TABLE 4, delete " 3σ placement change in x direction [nm]   3σ placement change in x direction [nm] "

and insert -- 3σ placement change in x direction [nm]   3σ placement change in y direction [nm] --

Signed and Sealed this
Thirtieth Day of May, 2017

Michelle K. Lee
*Director of the United States Patent and Trademark Office*

CERTIFICATE OF CORRECTION (continued)
U.S. Pat. No. 9,606,444 B2

<u>Column 16</u>
Line 52, delete "they" and insert -- the y --